United States Patent
Breinlinger et al.

(10) Patent No.: US 7,936,177 B2
(45) Date of Patent: May 3, 2011

(54) PROVIDING AN ELECTRICALLY CONDUCTIVE WALL STRUCTURE ADJACENT A CONTACT STRUCTURE OF AN ELECTRONIC DEVICE

(75) Inventors: Keith J. Breinlinger, San Ramon, CA (US); David P. Pritzkau, Brentwood, CA (US); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 157 days.

(21) Appl. No.: 12/044,893

(22) Filed: Mar. 7, 2008

(65) Prior Publication Data
US 2009/0224785 A1    Sep. 10, 2009

(51) Int. Cl.
*G01R 31/20* (2006.01)

(52) U.S. Cl. .............. 324/754.07; 324/754.11

(58) Field of Classification Search .......... 324/754–765, 324/158.1; 439/66, 91, 85, 260, 329, 492, 439/591
See application file for complete search history.

(56) References Cited

U.S. PATENT DOCUMENTS

| | | | |
|---|---|---|---|
| 5,629,837 A * | 5/1997 | Barabi et al. ............. | 361/767 |
| 6,576,485 B2 | 6/2003 | Khoury et al. | |
| 6,705,876 B2 | 3/2004 | Eldridge | |
| 6,764,349 B2 | 7/2004 | Provencher et al. | |
| 6,786,771 B2 | 9/2004 | Gailus | |
| 6,811,406 B2 | 11/2004 | Grube | |
| 6,827,611 B1 | 12/2004 | Payne et al. | |
| 6,872,085 B1 | 3/2005 | Cohen et al. | |
| 6,897,666 B2 * | 5/2005 | Swettlen et al. ............ | 324/754 |
| 6,917,102 B2 | 7/2005 | Zhou et al. | |
| 6,957,963 B2 * | 10/2005 | Rathburn .................. | 439/66 |
| 7,056,131 B1 * | 6/2006 | Williams .................. | 439/74 |
| 7,084,650 B2 | 8/2006 | Cooper et al. | |
| 7,088,118 B2 * | 8/2006 | Liu et al. .................. | 324/754 |
| 7,371,073 B2 * | 5/2008 | Williams .................. | 439/66 |
| 2004/0239349 A1 * | 12/2004 | Yamagishi et al. ......... | 324/754 |
| 2005/0007132 A1 * | 1/2005 | Richmond et al. ......... | 324/754 |
| 2006/0261827 A1 * | 11/2006 | Cooper et al. ............. | 324/754 |

OTHER PUBLICATIONS

Davide Fusco, "VHDM (very High Density Metric) Interconnect Technology," Binghamton University State University of New York (33 pages)
Int'l Search Report and Written Opinion of Int'l Search Authority, PCT/US2009/036396 (Jun. 29, 2009) (12 pages).
Int'l Preliminary Report on Patentability, PCT/US2009/036396 (Sep. 7, 2010) (6 pages).

* cited by examiner

*Primary Examiner* — Ha Tran T Nguyen
*Assistant Examiner* — Richard Isla Rodas
(74) *Attorney, Agent, or Firm* — Kirton & McConkie

(57) ABSTRACT

Devices and methods for providing, making, and/or using an electronic apparatus having a wall structure adjacent a resilient contact structure on a substrate. The electronic apparatus can include a substrate and a plurality of electrically conductive resilient contact structures, which can extend from the substrate. A first of the contact structures can be part of an electrical path through the electronic apparatus. A first electrically conductive wall structure can also extend from the substrate, and the first wall structure can be disposed adjacent one of the contact structures. The first wall structure can be electrically connected to a return current path within the electronic apparatus for an alternating current signal or power on the first contact structure.

26 Claims, 18 Drawing Sheets

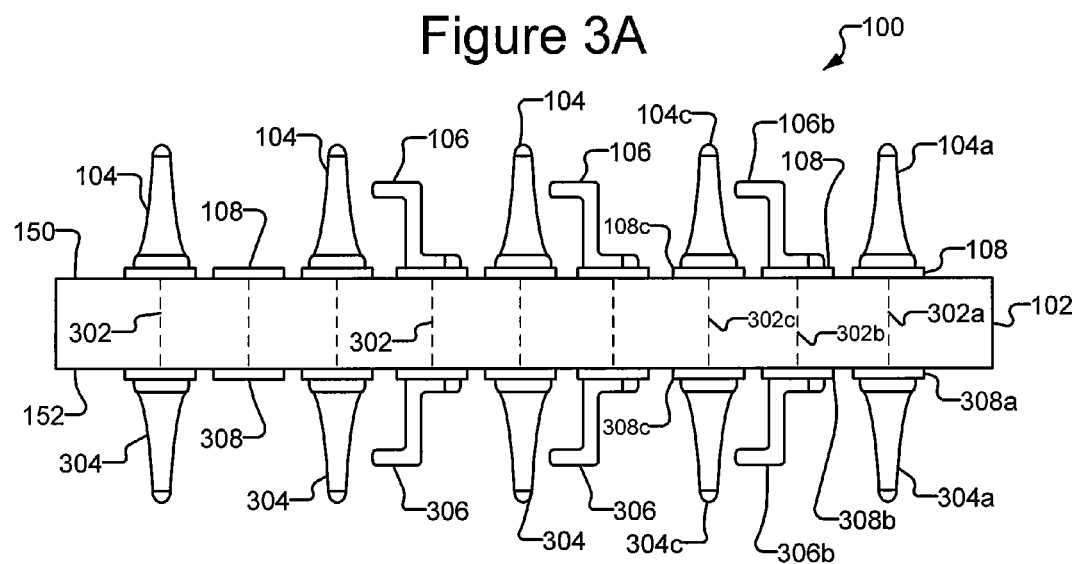
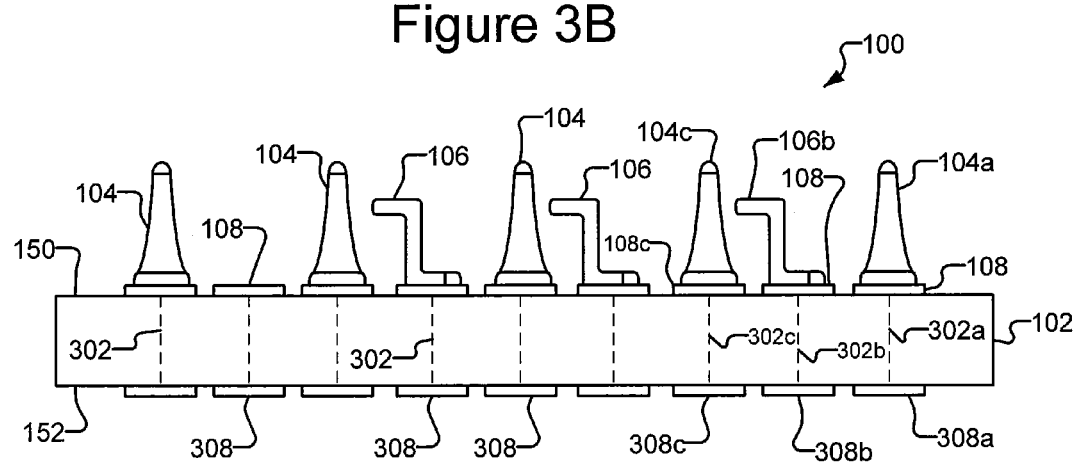

PROVIDING AN ELECTRICALLY CONDUCTIVE WALL STRUCTURE ADJACENT A CONTACT STRUCTURE OF AN ELECTRONIC DEVICE

BACKGROUND

Advances in the manufacture of electronic components such as semiconductor dies have given rise to the need for electronic devices with increasingly tight pitched groups of resilient, electrically conductive contact structures for contacting and making electrical connections with electronic components. Examples of such electronic devices include probe card assemblies used for testing dies of a semiconductor wafer and sockets for testing singulated dies. As signal carrying contact structures become increasingly more tightly pitched, however, problems can arise. For example, the closer signal carrying contact structures are to one another, the greater can be the tendency for cross-talk between such signal carrying contact structures. Such cross talk can be particularly pronounced when the signals are high frequency signals.

Some embodiments of the invention disclosed herein can address the foregoing problems as well as other problems in the prior art.

SUMMARY

In some embodiments, an electronic apparatus can include a substrate and a plurality of electrically conductive resilient contact structures, which can extend from the substrate. A first of the contact structures can be part of an electrical path through the electronic apparatus. A first electrically conductive wall structure can also extend from the substrate, and the first wall structure can be disposed adjacent one of the contact structures. The first wall structure can be electrically connected to a return current path within the electronic apparatus for an alternating current signal or power on the first contact structure.

In some embodiments, a process of making an electronic apparatus can include forming on a tool resilient contact structures and a wall structure. The wall structure can be formed such that it is disposed adjacent one the contact structures. The resilience contact structures and the wall structure can be transferred from the tool to a substrate.

In some embodiments, a process of testing an electronic device (DUT) can include effecting contact between a probing apparatus and the DUT, which can establish electrical paths through the probing apparatus to the DUT. Testing the DUT can also include providing system power or test signals to the DUT through an electrical path within the probing apparatus. A resilient contact structure extending from a surface of a substrate that is part of the probing apparatus can be part of the electrical path. Testing the DUT can also include returning current from the system power or the test signals through a return current path that is electrically connected to an electrically conductive wall structure extending from the surface of the substrate and disposed adjacent the contact structure.

BRIEF DESCRIPTION OF THE DRAWINGS

FIG. 3A is a side view of the electronic device of FIG. 1 configured as an interposer with contact structures and wall structures on both sides of the substrate according to some embodiments of the invention.

FIG. 3B is a side view of the electronic device of FIG. 1 configured with contact structures and wall structures on one side of the substrate according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, upper, lower, side, up, down, under, over, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 1:
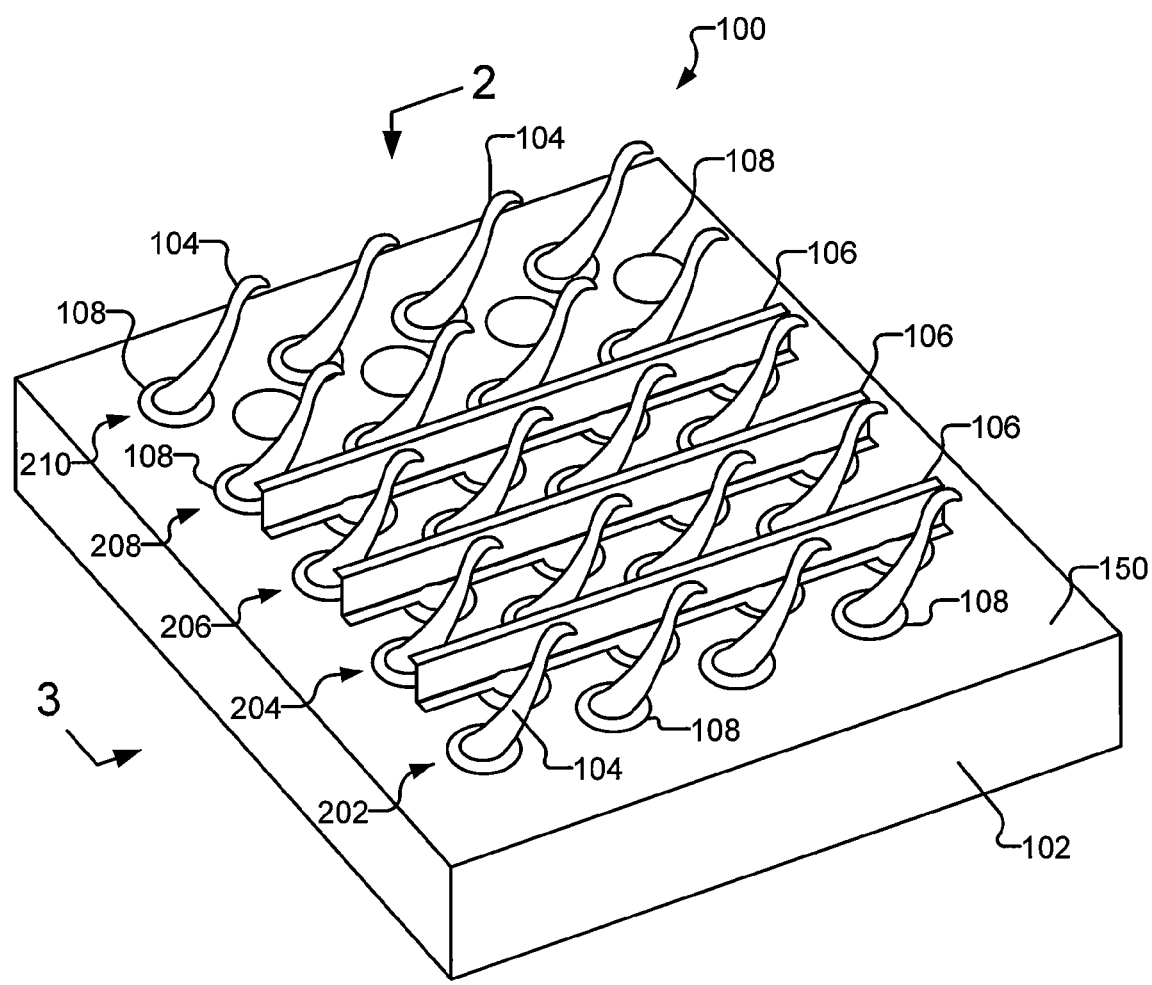
FIG. 1 is a perspective view of an exemplary electronic device according to some embodiments of the invention.
Figure 2:
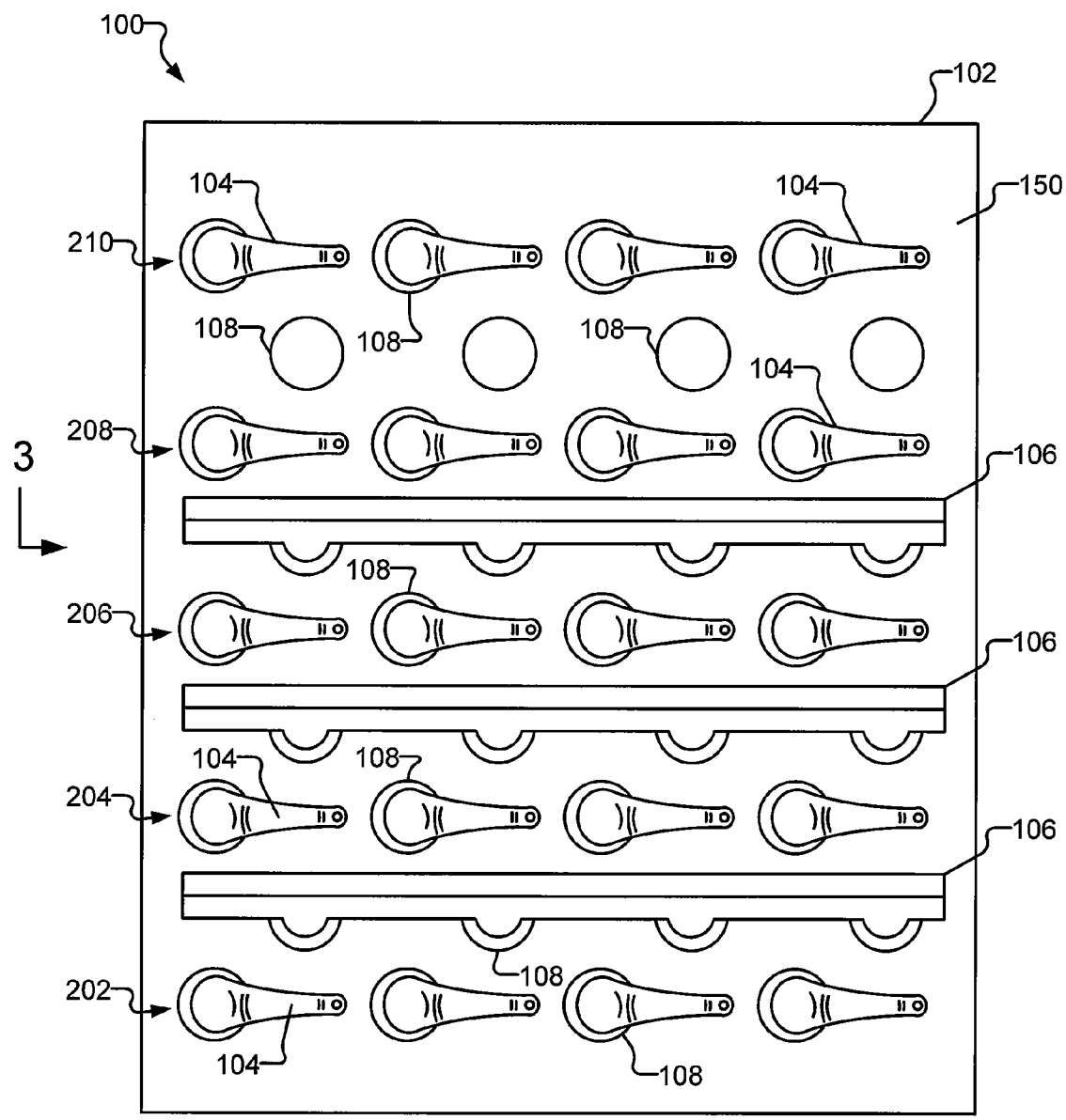
FIG. 2 is a top view of the electronic device of FIG. 1.

FIGS. 1-3B illustrate an exemplary electronic device 100 according to some embodiments of the invention. FIG. 1 illustrates a perspective view, FIG. 2 illustrates a top view, and FIG. 3A illustrates a side view of the electronic device 100. FIG. 3B illustrates a side view of the electronic device 100 with contact structures and wall structures on only one side.

As shown, the electronic device 100 can include a wiring substrate 102 (which can be a non-limiting example of a substrate) with electrically conductive terminals 108, which can be electrically connected by electrically conductive traces and/or vias (not shown) on and/or in the substrate 102 to each other and/or to other electrical elements (e.g., circuit components such as resistors, capacitors, integrated circuit dies, etc.) on and/or in the substrate 102. As also shown, electrically conductive, resilient contact structures 104 (e.g., probes) can be attached to ones of the terminals 108, and one or more electrically conductive wall structures 106 can be disposed around and/or between ones of the contact structures 104. Contact structures 104 and/or wall structures 106 can be fabricated on substrate 102 (or terminals 108), or contact structures 104 and/or wall structures can be fabricated other than on substrate 102 and can then be secured to substrate 102 (or terminals 108).

The substrate 102 can be any structure suitable for supporting contact structures 104 and wall structures 106. Non-limiting examples of suitable substrates 102 include a printed circuit board, a ceramic substrate, a flexible circuit, and substrates comprising organic or inorganic materials. The electronic device 100 can be or can be a part of any of many different types of electronic devices including, without limitation, an interposer, a probe head, a test socket, a semiconductor die (singulated or unsingulated from a semiconductor wafer), etc.

As mentioned, the resilient contact structures 104 can be attached, and thus electrically connected, to ones of the terminals 108. In other examples, the contact structures 104 can be attached directly to the substrate 102 and electrically connected to ones of the terminals 108 by, for example, traces (not shown) on and/or in the substrate 102. The resilient contact structures 104 can be any type of flexible, compliant, and/or spring-like electrically conductive structure. For example, resilient contact structures 104 can be spring contacts that comprise a compliant yet sturdy material that allows the spring contacts to repeatedly spring back after being compressed. Non-limiting examples of suitable contact structures 104 include composite structures formed of a core wire bonded to a conductive terminal (e.g., like terminals 108) and over coated with a resilient material as described in U.S. Pat. No. 5,476,211, U.S. Pat. No. 5,917,707, and U.S. Pat. No. 6,336,269. Contact structures 104 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of contact structures 104 are disclosed in U.S. Pat. No. 6,827,584, U.S. Pat. No. 6,640,432, U.S. Pat. No. 6,441,315, and U.S. Patent Application Publication No. 2001/0012739. Other non-limiting examples of contact structures 104 include conductive pogo pins, bumps, studs, stamped springs, needles, buckling beams, etc.

Figure 16:
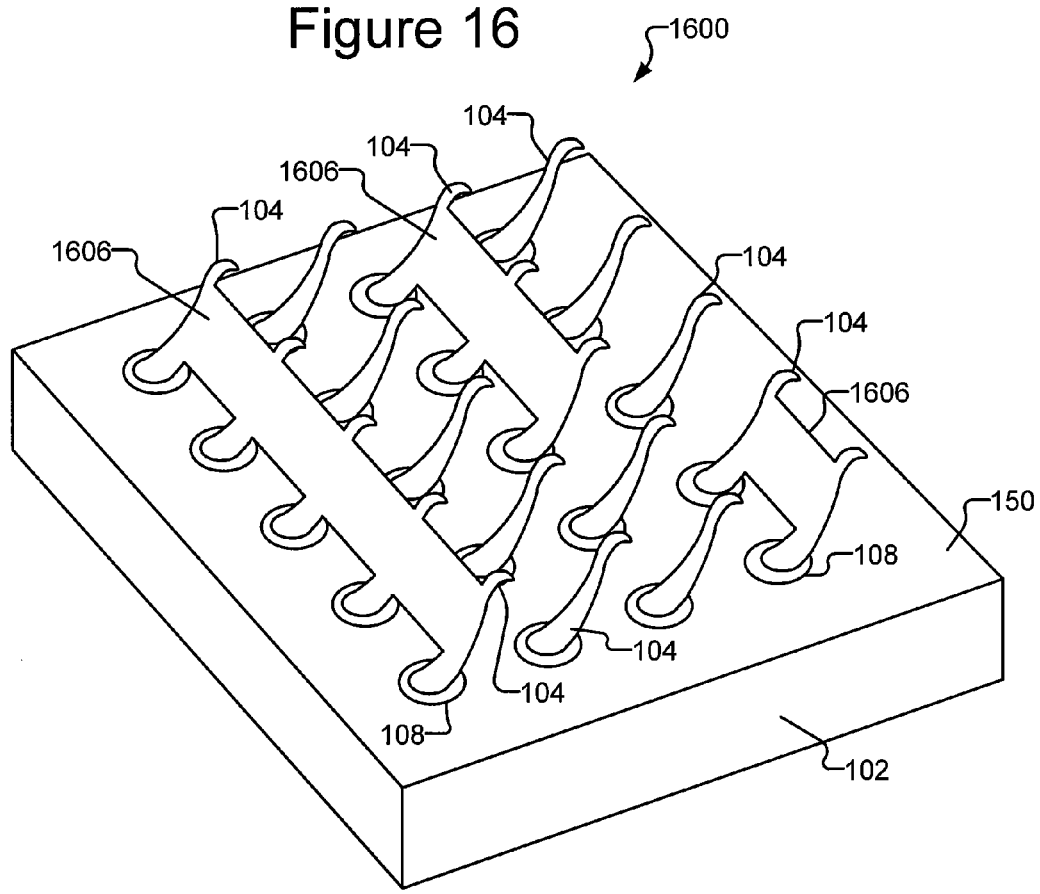
FIG. 16 illustrates an exemplary electronic device in which a wall structure is integral with contact structures according to some embodiments of the invention.
Figure 17:
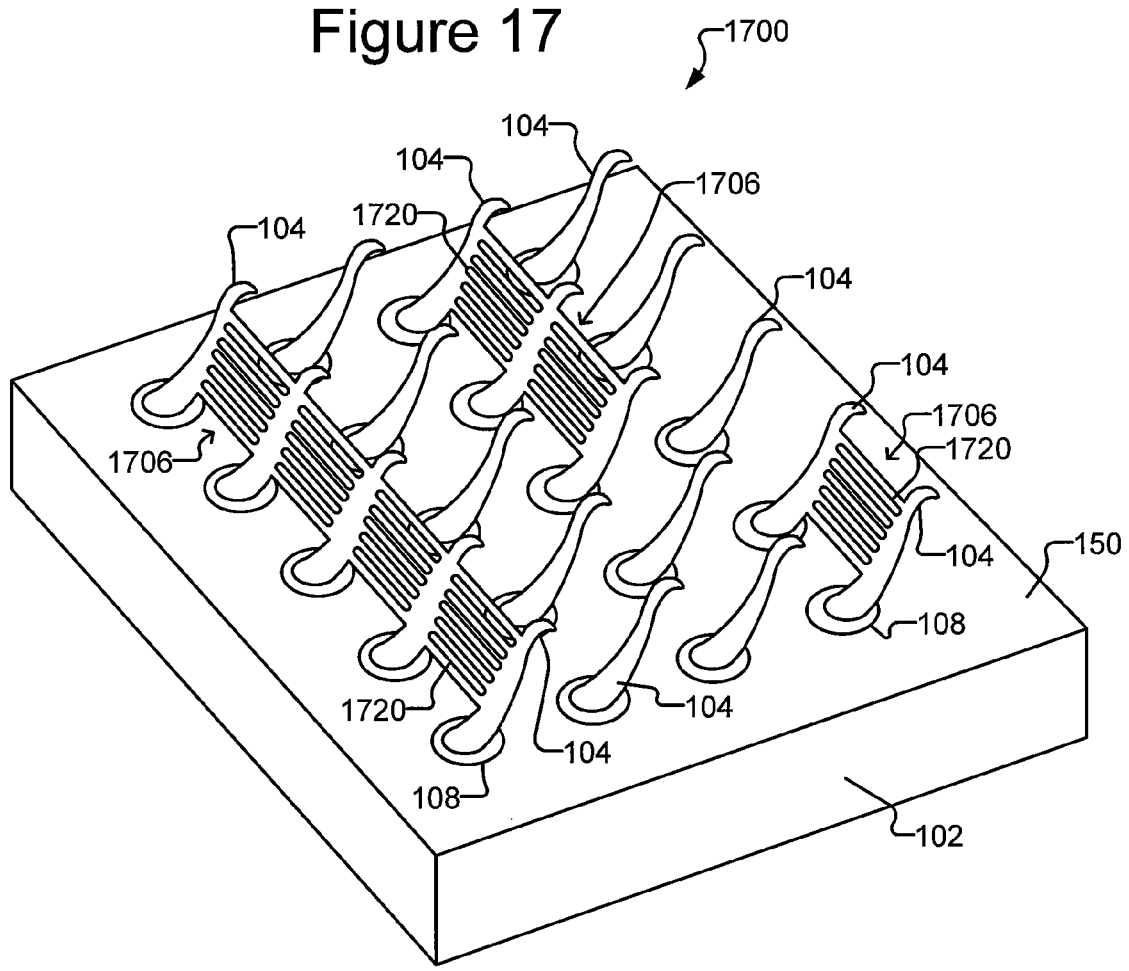
FIG. 17 illustrates an exemplary electronic device in which integral wall structures include perforations, slots, or holes according to some embodiments of the invention.
Figure 18:
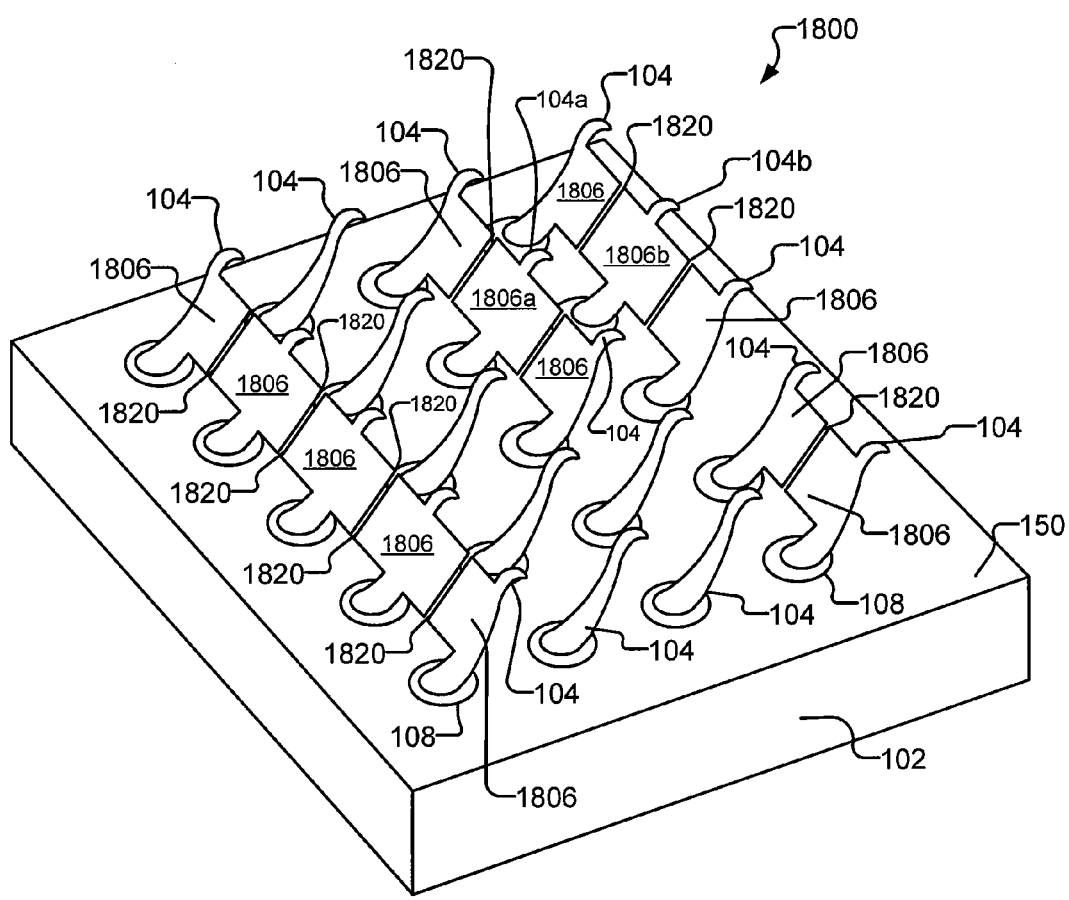
FIG. 18 illustrates an exemplary electronic device in which integral wall structures include a separation between individual contact structures.

The wall structures 106 can be any electrically conductive structure that can be disposed on substrate 102 and, in some embodiments, between ones of the contact structures 104. For example, the wall structures 106 can be in the form of rails such as are depicted in FIGS. 1-3B. (Other non-limiting examples of wall structures are shown in FIGS. 16-18.) As shown, the wall structures 106 can be attached, and thereby electrically connected, to ones of the terminals 108. In other examples, the wall structures 106 can be attached directly to the substrate 102 or other parts or elements of the substrate 102. As shown, the wall structures 106 can extend from the substrate 102 and be disposed adjacent one or more contact structures 104. In some embodiments, wall structures 106 can be disposed between at least two of the resilient contact structures 104. As will be seen, the wall structures 106 can thus provide any number of benefits and advantages including, without limitation, reducing an impedance of contact structures 104, providing low inductance delivery of power through contact structures 104, providing electromagnetic shielding for contact structures 104, acting as stop structures that limit compression of contact structures 104, and protecting contact structures 104 from physical damage.

As can be seen in FIG. 3A, the electronic device 100 can be an interposer with contact structures 104 disposed (e.g., attached to terminals 108) on a first surface 150 (e.g., a first side) of the substrate 102 and electrically conductive, resilient contact structures 304 disposed (e.g., attached to terminals 308) on a second surface 152 (e.g., a second side) of the substrate 102 opposite the first surface 150. (Contact structures 104, 304 can be examples of first, second, third, or fourth contact structures.) Wall structures 106 are depicted as disposed adjacent contact structures 104 on the first surface 150 of the substrate 102 and wall structures 306 are depicted as disposed adjacent contact structures 304 on the second surface 152 of the substrate 102. As also shown in FIG. 3A, ones of the terminals 108 on the first surface 150 of the substrate 102 can be electrically connected by vias 302 (shown in dashed lines in FIGS. 3A and 3B) internal to the substrate 102. As mentioned, configured as shown in FIG. 3A, the electronic device 100 can be an interposer and can, for example, provide electrical connections between a first electronic device in contact with ones of contact structures 104 and a second electronic device in contact with ones of contact structures 304. Contact structures 304 and wall structures 306 can be like contact structure 104 and wall structures 106, respectively. Moreover, functions, characteristics, properties, methods of making, connection configurations, etc. of contact structures 304 and wall structures 306 can be the same as or similar to functions, characteristics, properties, methods of making, connection configurations, etc. of contact structures 104 and/or wall structures 106.

Electronic device 100 need not, however, be an interposer with contact structures 104, 304 and wall structures 106, 306 on both sides but can be other types of electronic components or devices. For example, as illustrated in FIG. 3B, electronic device 100 can comprise substrate 102 with contact structures 104 and wall structure 106 on only one side 150 of substrate 102.

Regardless of whether electronic device 100 is configured as shown in FIG. 3A or 3B, one or more of wall structures 106, 306 can be electrically connectable to a particular voltage level (e.g., to system power, a voltage source, or a signal source) or ground. For example, one or both of contact structures 104a, 304a in FIG. 3A or terminal 308b in FIG. 3B can be electrically connected directly or indirectly (e.g., through other electrical conductors) to a particular voltage level. Contact structure 104a and/or 304a can further be connected to wall structures 106b, 308b by, for example, an electrical connection (not shown), which can be on or within substrate 102, between vias 302a and 302b. Likewise, terminal 308b can be electrically connected to wall structure 106b by via 302b. Moreover, one or both of contact structures 104c, 304c in FIG. 3A or terminal 308c in FIG. 3B can be electrically connected directly or indirectly (e.g., through other electrical conductors) to a signal source (not shown), a power source (not shown), or ground, and contact structure 304c in FIG. 3A or terminal 308c in FIG. 3B can be electrically connected to contact structure 104c by via 302c. Contact structure 104a, contact structure 304a, and/or terminal 308a can be a non-limiting example of an electrical connection electrically connectable to a source of signals or a source of system power, and contact structure 104c, 304c.

As mentioned, in some embodiments, wall structures 106, 306 can be configured to reduce inductance of contact structures 104 or 304 through which delivery of system power is provided. For example, a pair of contact structures (e.g., two of contact structures 104 or two of contact structures 304) can be part of electrical paths through which system power can be provided. One of the contact structures 104 or 304 in the pair can be configured as part of a "force" path for carrying system power from a power supply to a destination (e.g., an electronic element to be powered) and the other of the contact structures 104 or 304 in the pair can be configured as a "return" path for current return to the power supply. For example, the "force" path can be connected or connectable to the power output of a power supply, and the "return" path can be connected or connectable to a common ground. Common ground can be a common ground within the system (not shown) in which device 100 is used. For example, if device 100 is used in a system for testing DUTs, common ground can be the ground connections to the DUTs. The "return" path can thus be a common ground. The inductance of the "force" contact structure 104 or 304 and the "return" contact structure 104 or 304 can be reduced by doing the following: electrically connecting the "force" contact structure 104 or 304 to a wall structure 106 or 306 that is adjacent the "return" contact structure 104 or 304, and electrically connecting the "return" contact structure 104 or 304 to a wall structure 106 or 306 that is adjacent the "force" contact structure 104 or 304. A wall structure 106 or 306 can be "adjacent" a contact structure 104 or 304 if the wall structure 106 or 306 is next to or adjoins the contact structure 104 or 304. Typically, the closer the wall structure 106 or 306 that is connected to "force" is to the "return" contact structure 104 or 304, and the closer the wall structure 106 or 306 that is connected to "return" is to the "force" contact structure 104 or 304, the greater the reduction in inductance. Also, the closer the "force" contact structure 104 or 304 and the "return" contact structure 103 or 304 are to each other, the greater the reduction in inductance. Examples of the foregoing techniques for providing low inductance power delivery are illustrated and discussed below with respect to FIGS. 5 and 6, and an exemplary implantation in a probe card assembly is discussed below with respect to FIG. 14A.

As also mentioned above, in some embodiments, wall structures 106, 306 can be configured to reduce an impedance of one or more contact structures 104, 304 configured to carry electrical signals (e.g., test signals). For example, a wall structure can be configured to reduce an impedance of a contact structure 104 or 304 that is part of an electrical path configured to carry electrical signals (e.g., alternating current signals). A contact structure 104 and 304 can be configured to carry electrical signals by being part of an electrical path that is connected or connectable to a source of electrical signals. The impedance of the contact structure 104 and 304 can be reduced by electrically connecting an adjacent wall structure 106 or 306 to a current return path for the electrical signals. Because the electrical signals are alternating current signals, the current in the current return path can be alternating current. A wall structure 106 or 306 can be electrically connected to a current return path for signals passing through a contact structure 104 or 304 in a number of ways. For example, the contact structure 104 or 304 can be connected to common ground. If one or more ground planes (e.g., an electrically conductive layer of material connected to common ground) are on or embedded within substrate 102, the wall structure 106 or 306 can be connected to common ground by electrically connecting the wall structure 106 or 306 to one of the ground planes. As another example, if the path from a system power supply to a destination of the power is AC (alternating current) coupled to common ground, the contact structure 104 or 304 can be connected to the system power. The AC coupling can be anywhere along the path between the system power supply and the destination of the power. For example, the AC coupling can be through one or more capacitors connected from the system power supply to ground, and the one or more capacitors can be connected from the power path to ground anywhere from near the system power supply to near the destination of the power (e.g., an electronic component to which the power is being supplied). If one or more power planes (e.g., an electrically conductive layer of material connected to system power) are on or embedded within substrate 102, the wall structure 106 or 306 can be connected to system power by electrically connecting the wall structure 106 or 306 to one of the power planes.

A wall structure 106 or 306 can be "adjacent" a contact structure 104 or 304 if the wall structure 106 or 306 is next to or adjoins the contact structure 104 or 304. Typically, the closer the wall structure 106 or 306 is to the contact structure 104 or 304, the greater the reduction in impedance. Examples of the foregoing techniques for reducing impedance are illustrated in and discussed below with respect to FIGS. 5 and 6. An exemplary implementation of the foregoing in a probe card assembly is illustrated in FIG. 14B.

Figure 4:
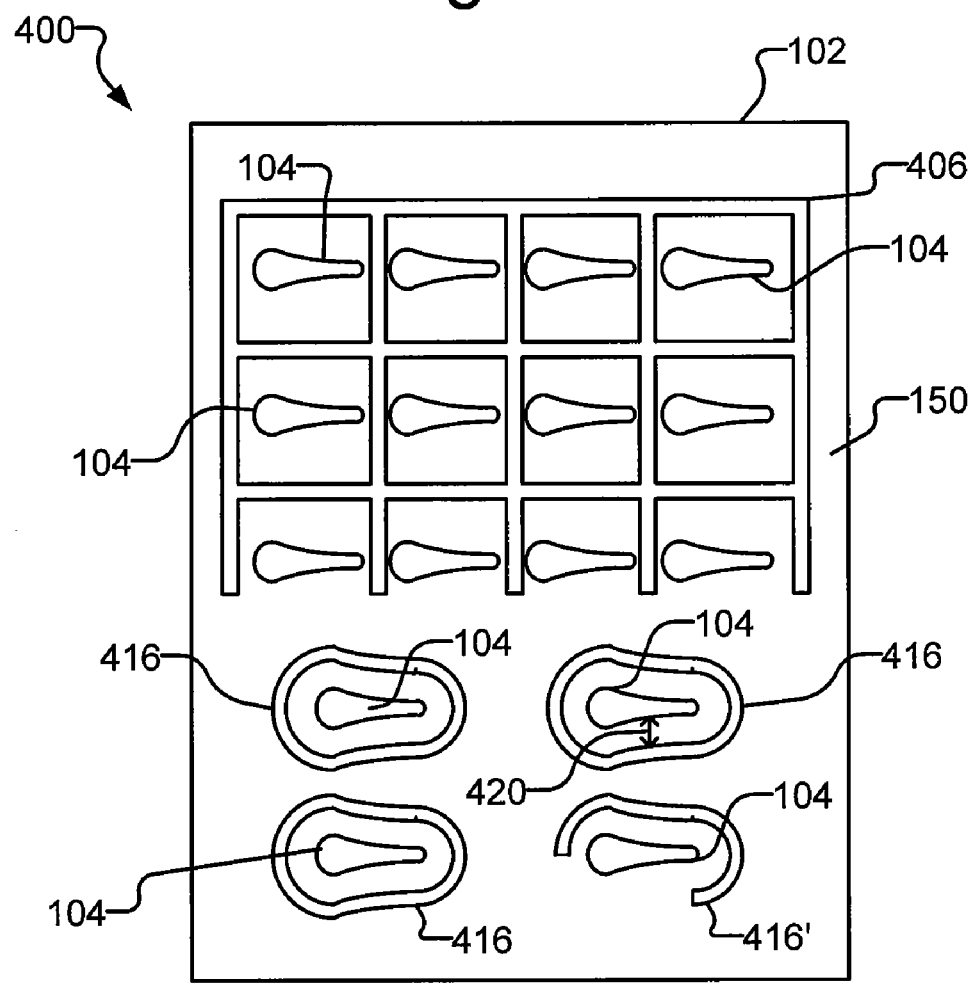
FIGS. 4 through 6 each show a top view of various alternative configurations of an electronic device in accordance with some embodiments of the invention.
Figure 5:
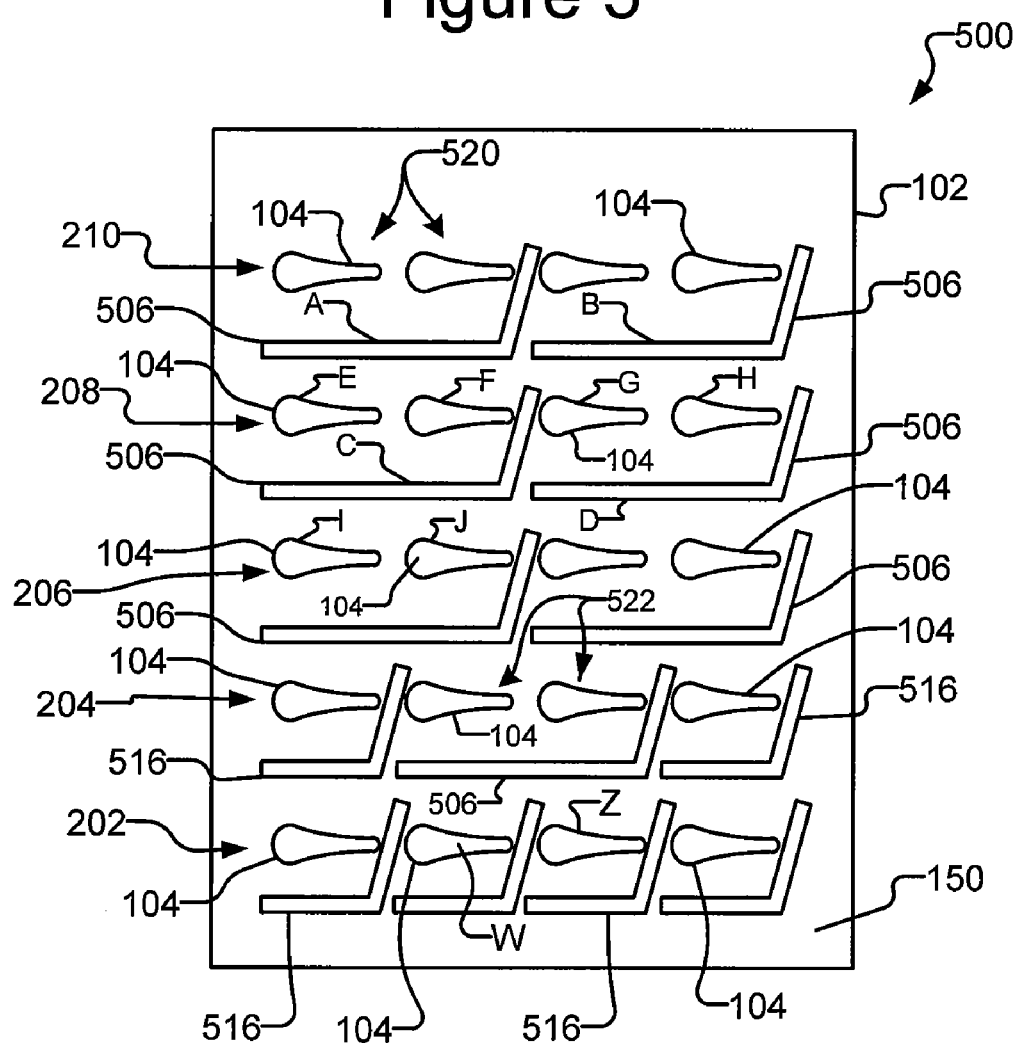
Figure 6:
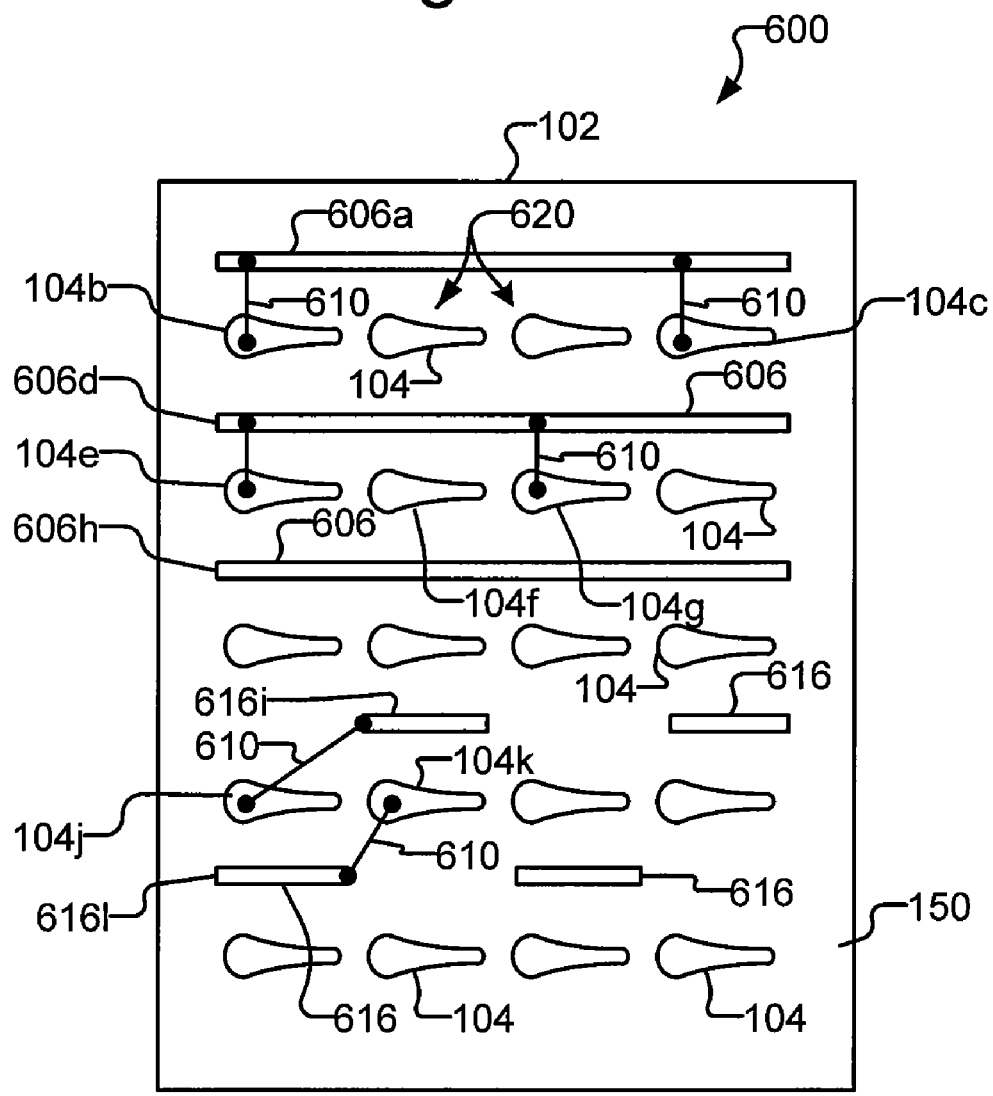

As also mentioned above, in some embodiments, the wall structures 106, 306 can function as electromagnetic shields. For example, because wall structures 106, 306 can be electrically conductive (e.g., the wall structures 106, 306 can comprise an electrically conductive metal). Disposed between or around ones of the contact structures 104, the wall structures 106 can thus partially or fully shield one or more of the contact structures 104 from electromagnetic interference. For example, the wall structures 106 can partially or fully shield one or more contact structures 104 from cross talk with other contact structures 104. As another example, the wall structures 106 can partially or fully shield one or more contact structures 104 from interference from ambient electromagnetic signals or radiation. Examples of shielding are illustrated in FIGS. 4, 5, and 6.

As also mentioned, wall structures 106, 306 can provide non-electrical benefits or functions. For example, in some embodiments, the wall structures 106 can be non-compliant, or mostly non-compliant. For example, the wall structures 106 can be rigid or substantially rigid. The wall structures 106 can thus act as stop structures, limiting compression of the resilient contact structures 104 when the contact structures 104 are pressed against another object (e.g., against an electronic device with which contact structures 104 are to make electrical connections). Such wall structures 106 can also mechanically protect the resilient contact structures 104 from incidental contact and associated damage, resulting in a device 100 that resists damage when handled. As can be seen in FIGS. 1, 3A, and 3B, contact structures 104 can extend a greater distance (a non-limiting example of a first distance) from surface 150 of substrate 102 than the distance (a non-limiting example of a second distance) wall structures 106 extend from surface 150.

Of course, in some embodiments, different wall structures 106, 306 on device 100 can function to provide two or more of any of the foregoing functions or benefits. For example, wall structures 106, 306 can reduce impedance of one or more contact structures 104, 304, reduce inductance of power delivery through one or more contact structures 104, 304, partially or fully shield one or more contact structures 104, 304, and/or act as stop structures as generally discussed above.

The configuration (e.g., layout, connections, shapes, number, etc.) of the contact structures 104, wall structures 106, and terminals 108 in FIGS. 1-3B are exemplary only, and many variations are possible. For example, the cross-section shape of the wall structures 106, 306 shown in FIGS. 1, 2, 3A, and 3B is exemplary only, and any other cross-sectional shape can be used, including without limitation an "I" cross-sectional shape, a "C" or backward "C" cross-sectional shape, or a rectangular or square cross-sectional shape. As another example, although FIGS. 1-3B show three wall structures 106 each attached to four terminals 108, more or fewer wall structures 106 can be used, and each wall structure 106 can be attached to any number of terminals 108. Alternatively, as mentioned, wall structures 106 can be attached to other portions or elements of the substrate 102. For example, wall structures 106 can be attached directly to a surface 150 of the substrate 102. In addition, although twenty contact structures 104 are shown attached to terminals 108 on surface 150 of the substrate 102, more or fewer contact structures 104 can be used, and the contact structures 104 can be disposed in any pattern on the surface 150. The number and layout of terminals 108 shown in FIGS. 1-3B is also exemplary only and other numbers and layouts of terminals 108 can be used. FIGS. 4-6 illustrate additional exemplary variations.

Although the wall structures 106 shown in FIGS. 1-3B are shaped in substantially straight lines and disposed between rows of resilient contact structures 104 a uniform distance from each contact structure 104 in a row, the wall structures 106 can have other shapes and configurations. FIG. 4 illustrates a non-limiting example of an electronic device 400 that includes substrate 102 and contact structures 104 but different wall structures 406, 416, 416' as compared to electronic device 100 of FIGS. 1-3B according to some embodiments of the invention. (Terminals 108 can be present but for simplicity are not shown in FIG. 4.) As shown in FIG. 4, wall structure 406 can comprise box-like structures that substantially surround each of contact structures 104. As also shown, wall structure 406 need not completely surround a contact structure 104 but, as shown, can partially surround a contact structure 104, for example, on three—but not four sides. Although not shown, wall structure 406 could partially surround a contact structure 104 on only two sides. Regardless of whether wall structure 406 fully or partially surrounds a contact structure 104, wall structure 406 can comprise structures like wall structures 106 between rows and columns of resilient contact structures 104 so that the wall structure 406 forms a checkerboard pattern on the substrate 102 as shown in FIG. 4. In this configuration, at least some of the resilient contact structures 104 can be substantially fully shielded from each other or partially shielded from each other, which can result in the contact structures 104 being placed in closer proximity to one another than otherwise might be possible without detrimental cross-talk affects among the contact structures 104.

FIG. 4 also illustrates wall structures 416, which can be shaped such that all or part of the wall structure 416 is approximately an equal distance 420 from a contact structure 104. For example, as shown in FIG. 4, wall structure 416 can fully surround a contact structure 104, and the entire inner contour 430 of the wall structure 416 can be approximately an equal distance 420 from an outer contour 440 of the contact structure.

FIG. 4 is exemplary only, and many variations are possible. For example, each box-like structure of wall structure 406 can surround more than one contact structure 104. For example, a box-like structure of FIG. 4 can surround two contact structures 104, three contact structures 104, four contact structures 104, etc. rather than surrounding one contact structure 104 as illustrated in FIG. 4. As another example of a possible variation of FIG. 4, wall structures 416 need not completely surround a contact structure 104. For example, as shown in FIG. 4, wall structure 416' in FIG. 4 partially surrounds a contact structure. Moreover, a wall structure 416 and/or 416' can surround (fully or partially) more than one contact structure 104.

FIG. 5 illustrates another non-limiting exemplary electronic device 500 that can include substrate 102 and contact structures 104 but different wall structures 506, 516 as compared to electronic device 100 of FIGS. 1-3B according to some embodiments of the invention. (Terminals 108 can be present but for simplicity are not shown in FIG. 5.) As shown, FIG. 5 illustrates various examples in which L shaped wall structures 506 are disposed adjacent two contact structures 104 and L shaped wall structures 516 are disposed adjacent one contact structure 104. Although not shown, some L-shaped wall structures (e.g., like wall structures 506 and/or 516) can be disposed to partially surround more than two contact structures 104. (The horizontal portions (as depicted in FIG. 5) of wall structures 506 and/or 516 can be non-limiting examples of a first portion of a wall structure, and the non-horizontal (as depicted in FIG. 5) portions of wall structures 506 and/or 516 can be non-limiting examples of a second portion of a wall structure.)

The contact structures 104 in FIG. 5 can be electrically connected to signal drivers, system power, and common ground in any number of configurations, and the wall structures 506, 516 can be connected to system power or common ground in any number of configurations. For example, as discussed above, a particular contact structure 104 can be configured for high speed delivery of a signal by configuring adjacent contact structure(s) and/or wall structure(s) to provide a return current path for the signal. In one such example, the contact structure 104 labeled F in FIG. 5 can be configured for high speed delivery of a signal by connecting the contact structure labeled E and the wall structures 506 labeled A and C to current return paths (e.g., common ground). As another example of a possible configuration, adjacent contact structures 104 can be configured to carry differential signals. In one such example, the contact structures 104 labeled G and H in FIG. 5 can be configured to carry differential signals, and one or more adjacent wall structures labeled B, C, and/or D can be connected to a return current path (e.g., common ground) for the signals on contact structures G and H.

In FIG. 5, the horizontal portion of the wall structure 506 labeled C can be a non-limiting example of a first part of the wall structure 506, and the nearly vertical portion that extends between the contact structures 104 labeled F and G of the wall structure 506 labeled C can be a non-limiting example of a second part of wall structure 506. The contact structure 104 labeled F can be a non-limiting example of a first contact structure in a first row (e.g., row 208 in FIG. 5), and contact structure 104 labeled J can be a non-limiting example of a second contact structure in a second row (e.g., row 206). Contact structure 104 labeled G can be a non-limiting example of a third contact structure; contact structure 104 labeled E can be a non-limiting example of a fourth contact structure; and contact structure 104 labeled I can be a non-limiting example of a fifth contact structure.

As another non-limiting example of variations of the electronic device 100 of FIGS. 1-3B, wall structures 106 need not extend substantially across an entire length of a row or column of contact structures 104. FIG. 6—which illustrates another non-limiting exemplary electronic device 600 that can include substrate 102 and contact structures 104 but different wall structures 606, 616 as compared to electronic device 100 of FIGS. 1-3B according to some embodiments of the invention—illustrates examples. (Terminals 108 can be present but for simplicity are not shown in FIG. 6.) As shown in FIG. 6, although exemplary wall structures 606 can extend substantially along an entire row of contact structures 104, segmented wall structures 616 can extend along less than an entire row of contact structures. It is noted that the L-shaped wall structures 506, 516 in FIG. 5 can be segmented, as illustrated in FIG. 5, in that those wall structures 506, 516 can be configured such that they do not extend substantially along an entire row of contact structures 104. Alternatively, one or more of L-shaped wall structures 506, 516 can extend substantially along an entire row of contact structures 104.

Any of the wall structures 406, 416, 416', 506, 516, 606, 616 can be generally similar to wall structures 106 in many respects. For example, wall structures 406, 416, 416', 506, 516, 606, 616 can have similar structural characteristics as wall structures 106, and wall structures 406, 416, 416', 506, 516, 606, 616 can be made and utilized in a same or similar manner as wall structures 106. It is also noted that, in any of the embodiments disclosed herein, some wall structures can be substantially straight, some can be curvilinear, and some can include on or more angled changes in direction.

The foregoing exemplary configurations of the wall structures 106, 406, 416, 416', 506, 516, 606, 616 can result in various signaling options for the electronic devices 100, 400, 500, 600. For example, some resilient contact structures 104 can be shielded, while other resilient contact structures 104 can be left unshielded. One row or column of resilient contact structures 104 can be shielded from another row or column of resilient contact structures 104. Some resilient contact structures 104 can be configured as part of a differential pair. Many other possible configurations are also possible. For example, although not shown, some electronic devices 100, 400, 500, 600 can be configured to allow a user to select between one of a plurality of available voltage sources to connect to a particular wall structure 106. In a non-limiting example, a wall structure 106 can have a switch (not shown) that can be selectively switched between a first voltage source and a second voltage source (e.g., system power and common ground, which can be utilized as discussed above, for example, to control the impedance of a contact structure 104, 304 or reduce the inductance of a contact structure 104, 304 carrying power). Non-limiting examples of suitable switches (not shown) include electronic switches, field effect transistors, and relays.

FIGS. 1-6 illustrate non-limiting examples of some of the foregoing signaling options. For example, configured as shown in FIG. 2, wall structures 106 can shield electromagnetically the contact structures in row 202 from the contact structures in row 204, the contact structures in row 204 from the contact structures in row 206, and the contact structures in row 206 from the contact structures in row 208. (Note that in the example shown in FIG. 2, the contact structures in row 208 are not shielded from the contact structures in row 210. Alternatively, one or more of the contact structures 104 in row 210 can be configured to shield others of the contact structures 104 in row 210.) For example, wall structures 106 in FIG. 1 can be configured as electromagnetic shields (between the contact structures 104 in rows 202, 204, 206, and 208) by connecting wall structures 106 to common ground, and one or more of the contact structures 104 in row 210 can likewise be configured as electromagnetic shields by also connecting those contact structures to common ground.

In the configuration shown in FIG. 5, in some cases, single contact structures 104 can be electromagnetically shielded from every other contact structure 104, and in other cases, pairs of contact structures 104 can be electromagnetically shielded from other contact structure 104. For example, in FIG. 5, L shaped wall structures 506 can electromagnetically shield pairs of contact structures 104, for example, like pairs 520 and/or 522, and L shaped wall structures 516 can electromagnetically shield single contact structures 104, for example, like the contact structures 104 labeled W and Z in FIG. 5. The contact structures 104 that are shielded as pairs (e.g., pair 520 and/or pair 522) can be configured to carry differential signals (e.g., a signaling technique in which a signal is transmitted over two signal paths, one path carrying the signal and the other path carrying the compliment of the signal). (Any of rows 202, 204, 206, 208, 210 can be a non-limiting example of a first row or a second row.) Alternatively, non-adjacent contact structures 104 can be configured to carry differential signals.

FIG. 6 illustrates additional wiring and signaling options. As shown in FIG. 6, electrical connectors 610 (e.g., conductive traces and/or vias in and/or on the substrate 102, each of which can provide a different level of performance) can electrically connect a contact structure 104 with a wall structure 606 and/or 616. A voltage source or ground can thus be provided to a wall structure 606 and/or 616 through one of the contact structures 104. In such a case, wall structures 606 and/or 616 need not be attached to or electrically connected to terminals 108 (not shown in FIG. 6). Even with connectors 610, however, wall structures 606, 616 can nevertheless be attached to terminals 108, for example, in the same way that wall structures 106 are attached to terminals 108 in FIGS. 1-3B.

In one exemplary signaling scenario illustrated in FIG. 6, a wall structure 606a, contact structures 104b, 104c, and wall structure 606d can surround and thus electromagnetically shield a pair 620 of contact structures 104. In accordance with the discussion above, pair 620 can be a shielded differential pair. That is, pair 620 of contact structures 104 shielded by wall structures 606a, 606d and contact structures 104b, 104c can be configured to carry differential signals. As discussed above, wall structures 606a, 606d and contact structures 104b, 104c can be configured to provide a return path for the current of the differential signals on pair 620 and thereby control the impedance of the pair 620 of contact structures 104. For example, as discussed above, wall structures 606a, 606d and contact structures 104b, 104c can be configured to provide a return path for current by being connected to common ground or alternatively to system power.

In like manner, the contact structure 104f in FIG. 6 can be surrounded by—and thus be electromagnetically shielded by—wall structures 606d, 606h and contact structures 104e, 104g. As discussed above, wall structures 606d, 606h and contact structures 104e, 104g can be configured to provide a return path for the current of a signal on contact structure 104f and thereby control the impedance of contact structure 104f. For example, as discussed above, wall structures 606d, 606h and contact structures 104e, 104g can be configured to provide a current return path by being connected to common ground or system power.

As another example of a signaling configuration, the contact structures 104*j* and 104*k* in FIG. 6 can be configured to provide power to an electronic device (not shown) in contact with contact structures 104. For example, one of contact structures 104*j* and 104*k* can be configured as "force" (e.g., connected to the output of a system power supply) and the other of contact structures 104*j* and 104*k* can be configured as "return" (e.g., connected to common ground). The inductance of contact structures 104*j* and 104*k* can be reduced by configuring wall structures 616*i* and 616*l* as current return paths for the force and return electricity through contact structures 104*j* and 104*k*. A non-limiting example is shown in FIG. 6. As shown, wall structure 616*i* can be located adjacent contact structure 104*k*, and wall structure 616*l* can be located adjacent contact structure 104*j*. As mentioned above, one of contact structures 104*j* and 104*k* can be configured as "force" and the other can be configured as "return" for power delivery to an electronic device (not shown) in contact with contact structures 104. Wall structures 616*i* and 616*l* can be connected to "force" or "return" such that each wall structure 616*i*, 616*l* is connected to the opposite of "force" or "return" as the contact structure 104*j*, 104*k* adjacent the wall structure 616*i*, 616*l*. For example, if contact structure 104*j* is connected to "force" (e.g., the power output of a system power supply), then the wall structure 616*l* adjacent contact structure 104*j* can be connected to "return" (e.g., common ground or the ground connection of the system power supply). Continuing with this example, contact structure 104*k* can be connected to "return," and the wall structure 616*i* adjacent contact structure 104*k* can be connected to "force." Still continuing with the foregoing example, one non-limiting technique for connecting wall structure 616*l* to "return" can be to provide a connector 610 between contact structure 104*k* and wall structure 616*l*, and a non-limiting technique for connecting wall structure 616*i* to contact structure 104*j* can be to provide a connector 610 between contact structure 104*j* and wall structure 616*i*. Alternatively, no wall structure need be connected to "force." Thus, for example, wall structure 616*i* in the above example can be connected to "return" rather than "force," or wall structure 616*i* can be not connected to either "return" or "force." If wall structure 616*i* is not connected to "return" or "force," wall structure 616*i* need not be included on device 600.

Although FIG. 6 illustrates one pair of contact structures 104*k*, 104*j* configured as "force" and "return" for system power, two or more such pairs of contact structures can be provided. Moreover, each such pair can be electrically connected to wall structures generally as shown in FIG. 6 and discussed above such that each contact structure is adjacent a wall structure that is connected to the opposite of "force" or "return" as the contact structure. Moreover, the contact structures 104 in each such pair of "force" and "return" can be located in close proximity to each other. In other embodiments, however, there can be an unequal number of "force" contact structures 104 and "return" contact structures 104. For example, there can be more "force" contact structures 104 than "return" contact structures or vice-versa. As another example, each "force" contact structure 104 need not be located in close proximity to a "return" contact structure 104, nor need each "force" contact structure 104 or "return" contact structure 104 be located adjacent a wall structure connected to the opposite "force" or "return" of the contact structure 104.

The configurations and electrical connections among the contact structures 104 and wall structures 606, 616 illustrated in FIG. 6 are exemplary only and many variations and alternatives are possible. Indeed, the possible combination of various wall structures 606, 616, electrical connections 610 between contact structures 104 and wall structures 606, 616, and various voltage sources connected to the wall structures 606, 616 provides a great number of possible configurations for the electronic device 600.

Each of electronic devices 400, 500, 600 illustrated in FIGS. 4-6 can be configured as shown in FIG. 3A or as shown in FIG. 3B. For example, wall structure 406 can replace wall structures 106 in FIG. 3A or 3B, and a wall structure similar to wall structure 406 can replace wall structure 306 in FIG. 3A. Likewise, wall structures 506, 516 can replace wall structures 106 in FIG. 3A or FIG. 3B, and wall structures similar to wall structures 506, 516 can replace wall structures 306 in FIG. 3A. Similarly, wall structures 606, 616 with connections 610 can replace wall structures 106 in FIG. 3A or FIG. 3B, and wall structures similar to wall structures 606, 616 with connections 610 can replace wall structures 306 in FIG. 3A.

The contact structures 104 and wall structures 106, 306, 406, 416, 416', 506, 516, 606, 616 can be made in any suitable manner. FIGS. 7-12 illustrate a non-limiting exemplary method of making such contact structures and wall structures according to some embodiments of the invention. Although FIGS. 7-12 illustrate and are discussed below with respect to making contact structures 104 and wall structures 106, the illustrated method can be used to make any of contact structures 304 and wall structures 306, 406, 416, 416', 506, 516, 606, 616 as well as other configurations of similar contact structures and wall structures.

Figure 7:
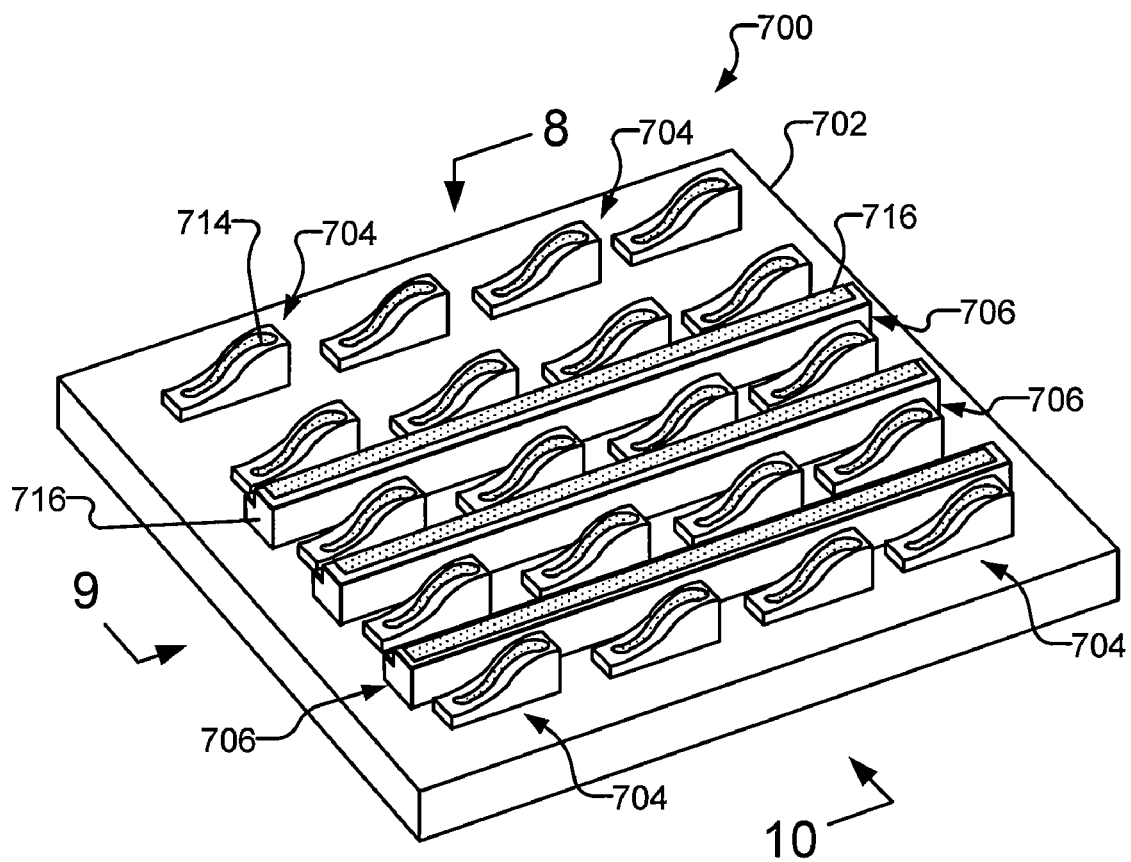
FIG. 7 is a perspective view of an exemplary tool according to some embodiments of the invention.
Figure 8:
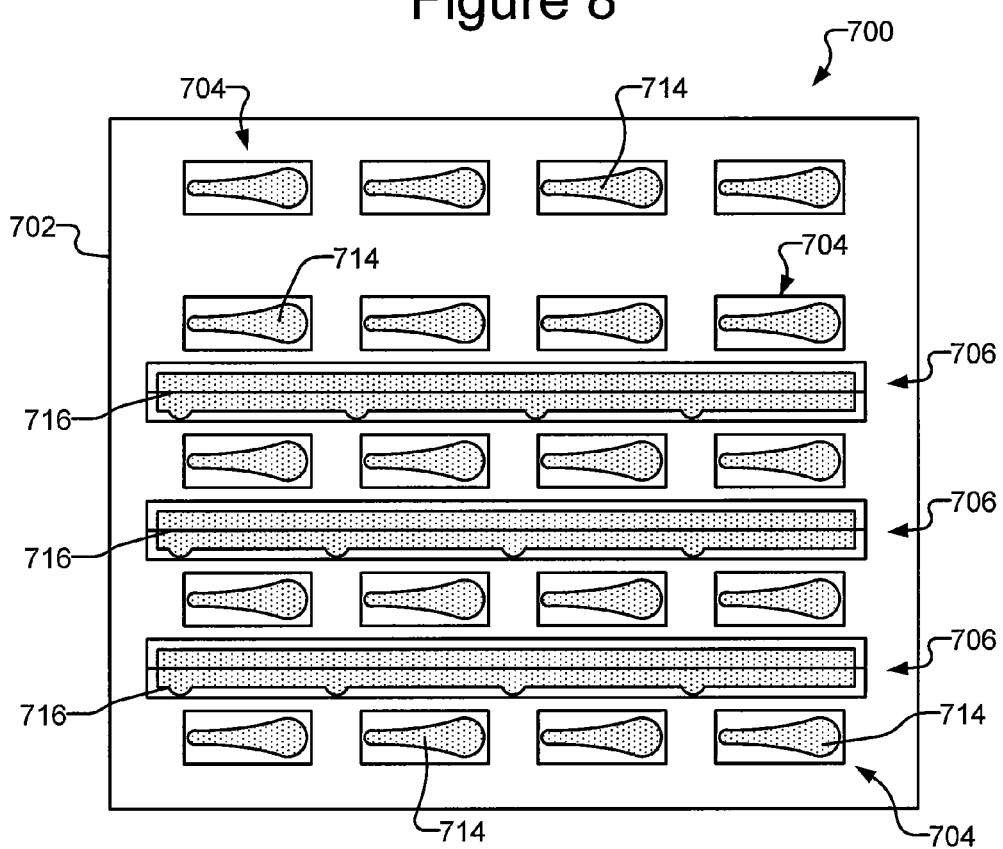
FIG. 8 is a top view of the tool of FIG. 7.
Figure 9:
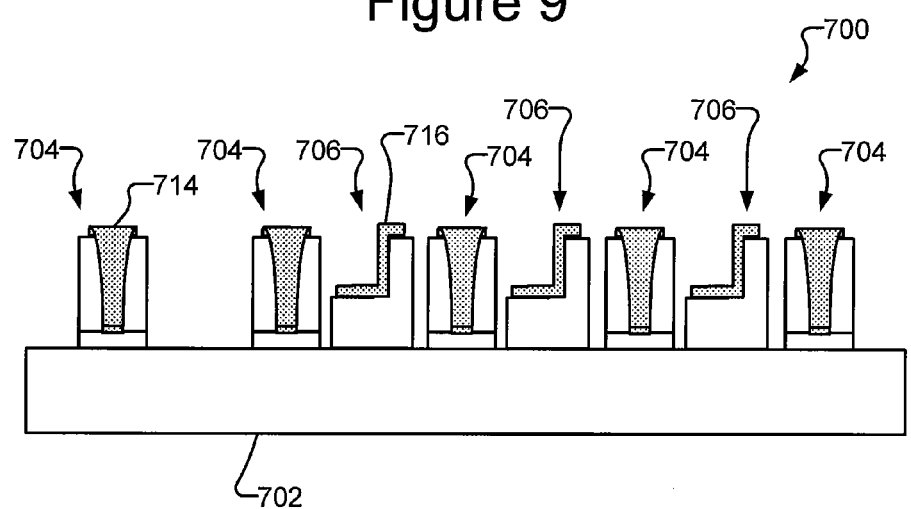
FIG. 9 is a side view of the tool of FIG. 7.
Figure 10:
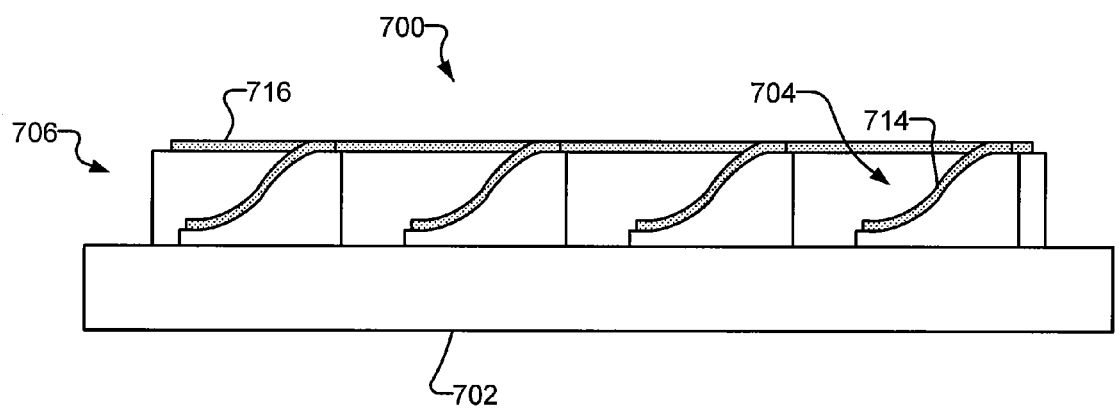
FIG. 10 is another side view of the tool of FIG. 7.

FIGS. 7-10 show an exemplary tool 700 that can be used to create resilient contact structures 104 and wall structures 106 according to some embodiments of the invention. FIG. 7 shows a perspective view of tool 700. FIG. 8 shows a top view and FIGS. 9 and 10 show side views of tool 700.

As shown, tool 700 can comprise a support structure 702 (which can be a non-limiting example of a base) and a plurality of contact mandrels 704 (which can be non-limiting examples of contact mandrel protrusions) and a plurality of wall mandrels 706 (which can be non-limiting examples of wall mandrel protrusions) extending from the support structure 702. As shown, each contact mandrel 704 can include an electrically conductive seed area 714, and each wall mandrel 706 can include an electrically conductive seed area 716. The seed area 714 on each contact mandrel 704 can be in a desired shape of a contact structure to be formed on the contact mandrel 704, and the seed area 716 can be in a desired shape of a wall structure to be formed on the wall mandrel 706. For example, seed areas 714, 716 can represent areas on tool 700 on which material can be deposited to form contact structures 104 and wall structures 106.

Figure 11:
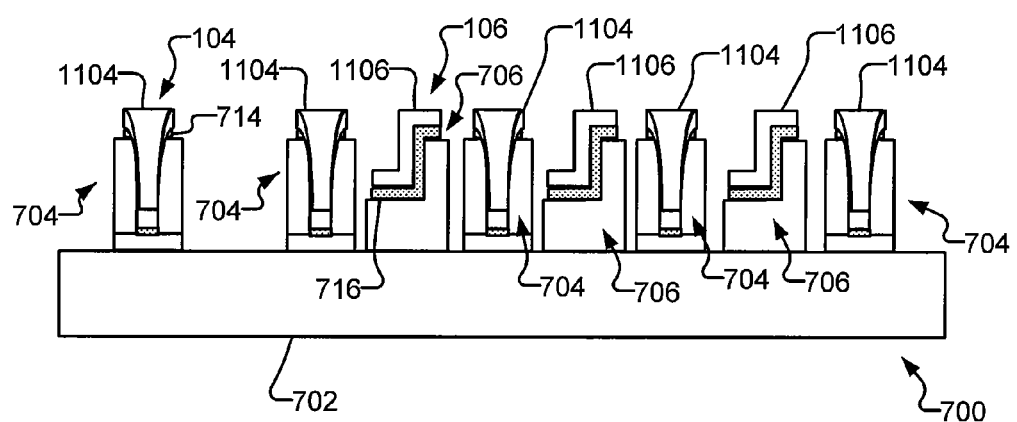
FIG. 11 shows exemplary deposit of material forming contact structures and wall structures onto the tool of FIG. 7 according to some embodiments of the invention.

As shown in FIG. 11, resilient contact structures 104 can be formed by depositing material 1104 onto the seed areas 714 of contact mandrels 704, and wall structures 106 can be formed by depositing material 1106 onto the seed areas 716 of the wall mandrels 706. Because seed areas 714, 716 can be electrically conductive, material 1104 and material 1106 can be deposited onto seed areas 714, 716 by electroplating. As is known, an electroplating process can be controlled such that material electroplates substantially only onto the seed areas 714, 716. Non-limiting examples of suitable materials for material 1104 or material 1106 include palladium, gold, rhodium, nickel, cobalt, silver, platinum, conductive nitrides, conductive carbides, tungsten, titanium, molybdenum, rhenium, indium, osmium, copper, refractory metals, and their alloys including combinations of the foregoing.

The support structure 702 and the mandrels 704, 706 can be electrically non-conductive, and the seed areas 714, 716 can comprise a layer of conductive material deposited onto the mandrels 704, 706. Alternatively, mandrels 704, 706 and optionally support structure 702 can comprise an electrically conductive material, and a surface of the mandrels 704, 706 and optionally support structure 702 can be coated with an electrically non-conductive material in a pattern that exposes only the seed areas 714, 716. In such a case, seed areas 714, 716 can be portions of the support structure 702 that are exposed through openings in the coating (not shown) on the support structure 702. Other configurations are also possible.

Rather than or in addition to electroplating, other deposition methods can be used to deposit the material 1104 forming the contact structures 104 onto the contact mandrels 704 and the material 1106 forming the wall structures 106 onto the wall mandrels 706. For example, the material 1104 forming the contact structures 104 can be deposited onto the contact mandrels 704 and the material 1106 forming the wall structures 106 can be deposited onto the wall mandrels 706 by any other process by which materials 1104, 1106 can be deposited onto mandrels 704, 706. Non-limiting examples of such alternative deposition techniques include chemical vapor deposition, physical vapor deposition, sputter deposition, electroless plating, electron beam deposition, evaporation (e.g., thermal evaporation), flame spring coating, rapid prototype printing or additive processes such as inkjet aerosol deposition or vapor assisted deposition, and plasma spray coating. Seed areas 714, 716 may not be useful with some of the foregoing deposition techniques and therefore need not be included on mandrels 704, 706. Other methods can be used to control the deposition of material 1104, 1106 forming the contact structures 104 and wall structures 106 onto mandrels 704, 706. For example, such material 1104 and/or 1106 can be deposited onto mandrels 704 and/or 706 through masks or stencils (not shown) in the desired shapes of the contact structures 104 and wall structures 106. As another example, such material 1104 and/or 1106 can be deposited onto the mandrels 704 and/or 706 and optionally the support structure 702 and then portions of the deposited material can be removed leaving material on contact mandrels 704 in the desired shapes of the contact structures 104 and material on wall mandrels 706 in the desired shapes of the wall structures 106.

Figure 12:
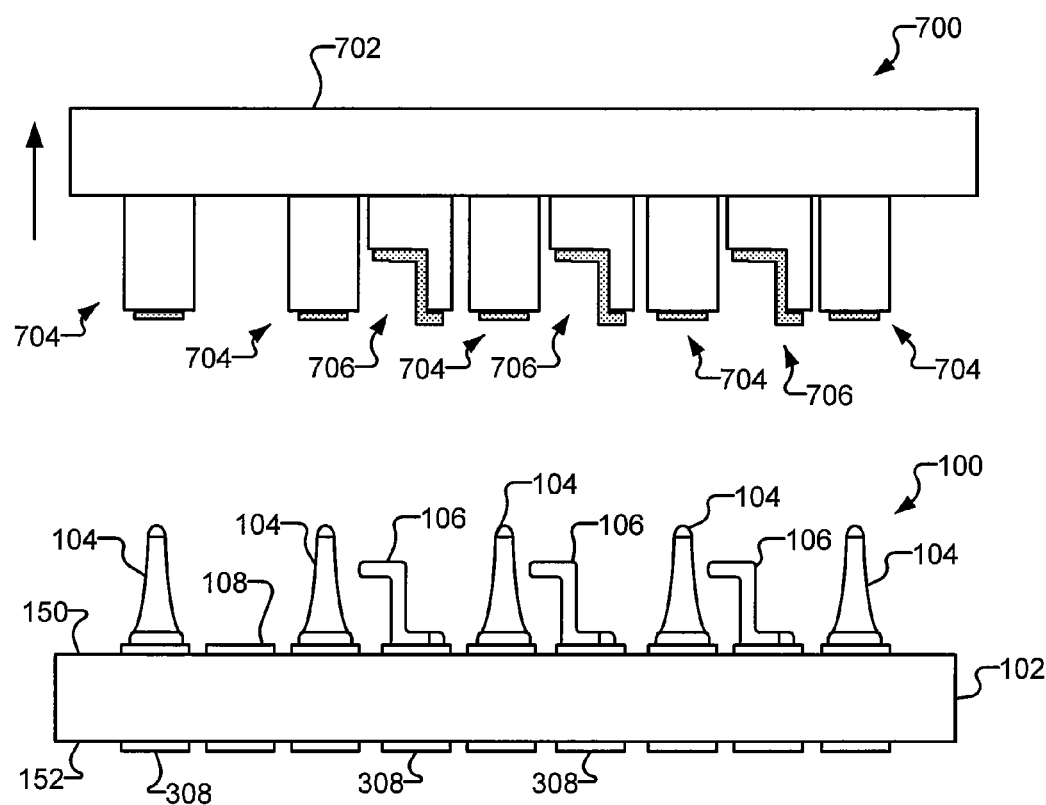
FIG. 12 shows the resilient contact structures and wall structures of FIG. 11 after they have been released from the tool of FIG. 7 and attached to an electronic device according to some embodiments of the invention.

After contact structures 104 and wall structures 106 are formed on mandrels 704, 706, contact structures 104 and wall structures 106 can be transferred to substrate 102 as illustrated in FIG. 12. Tool 700 can be positioned such that parts of contact structures 104 and wall structures 106 are brought into contact or proximity with substrate 102 (e.g., with terminals 108). The contact structures 104 and wall structures 106 can then be attached to the substrate 102 (e.g., terminals 108). Contact structures 104 and wall structures 106 can be attached to substrate 102 in FIG. 12 by a variety of methods. Some non-limiting examples of attachment methods include soldering, brazing, and using an adhesive (e.g., an electrically conductive adhesive or an electrically non-conductive adhesive).

The contact structures 104 and wall structures 106 can be released from tool 700, and tool 700 can be removed as shown in FIG. 12. The contact structures 104 and wall structures 106 can be released from mandrels 704, 706 in any suitable manner. For example, the contact structures 104 and wall structures 106 can be released from the mandrels 704, 706 by thermal shock in which the tool and the contact structures 104 and wall structures 106 can be heated and then dipped into a rinse water to cause the tool 700, on one hand, and the contact structures 104 and wall structures 106, on the other hand, to expand at different rates and thereby separate or permit easy separation of the contact structures 104 and wall structures 106 from the tool 700. As another non-limiting example, prior to depositing the material 1104, 1106 onto the seed areas 714, 716, the seed areas 714, 716 can be coated with a release layer (not shown) that is readily etched away without substantially etching the contact structures 104 and wall structures 106. The contact structures 104 and wall structures 106 can be released from the mandrels 704, 706 by etching away the release layer. Aluminum, which can be etched with sodium hydroxide, is a non-limiting example of a suitable release layer. Other non-limiting examples of suitable release layers include copper, gold, titanium, tungsten, and silver.

The process illustrated in FIGS. 7-12 is exemplary only, and the contact structures 104 and wall structures 106 can be made using modified processes or other processes. For example, contact structures 104 can be made on a first tool 700 and wall structures 106 can be made on a second tool (e.g., a tool like 700). The contact structures 104 can then be transferred from the first tool 700 to substrate 102, and the wall structures 106 can be transferred from the second tool to substrate 102. Other examples of variations of the process illustrated in FIGS. 7-12 or of different process include that contact structures 104 and wall structures 106 can be made on the substrate 102 in one or more patterned layers of a masking material (e.g., a photoresist material). As an alternative, the contact structures 104 and wall structures 106 can be made on a sacrificial substrate (not shown) in one or more patterned layers of a masking material (e.g., a photoresist material) and transferred from the sacrificial substrate to the substrate 102. Non-limiting examples of the foregoing techniques are described in U.S. patent application Ser. No. 09/539,287; U.S. Pat. No. 6,268,015; and U.S. Pat. No. 6,939,474.

Figure 13:
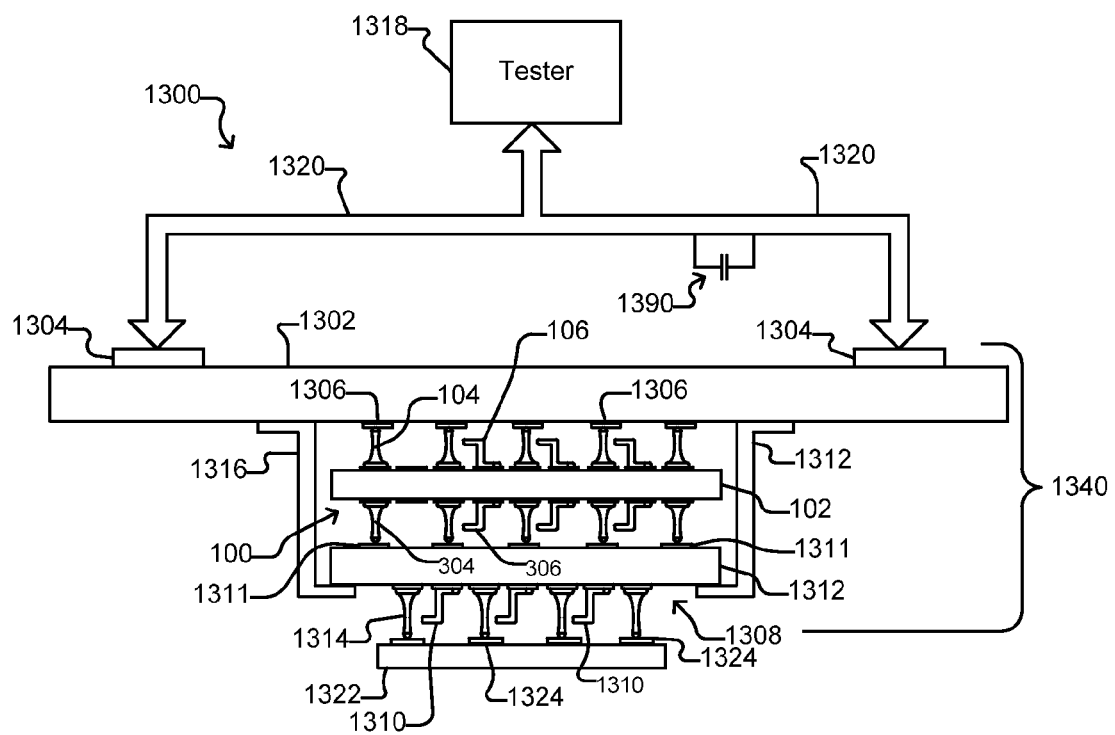
FIG. 13 illustrates a schematic view of an exemplary test system in accordance with some embodiments of the invention.

There are many possible uses and applications for electronic device 100. For example, electronic device 100 or similar devices (e.g., any of electronic devices 400, 500, and/or 600) can be part of a probe cad assembly for testing electronic devices such as semiconductor dies. FIG. 13 shows an exemplary probe card assembly 1340 (which can be a non-limiting example of a probing apparatus or device) and a simplified block diagram of a test system 1300 in which the probe card assembly 1340 can be used to test one or more electronic devices (e.g., DUT 1322) according to some embodiments of the invention. Alternatively, device 100 could be used as a test socket, a board-to-board interconnect, a chip-to-board connector, a chip-to-chip connector, or a burn-in socket.

As shown in FIG. 13, the probe card assembly 1340 can comprise a wiring substrate 1302, an interposer (which can be a non-limiting example of a first component of a probing apparatus) in the form of electronic device 100, and a probe head 1308. (The wiring substrate 1302 or the probe head 1308 can be a non-limiting example of a second component of a probing apparatus.) The wiring substrate 1302 can comprise electrical connectors 1304 (which can be a non-limiting example of an electrical connection or an electrical interface to a tester) and electrical terminals 1306. The electrical connectors 1304 can be configured to make individual electrical connections with each of a plurality of communications channels 1320 to and from a tester 1318. Connectors 1304 can be pads for receiving pogo pins at the ends of channels 1320, zero-insertion-force connectors at the ends of channels 1320, or any other electrical connection device suitable for making electrical connections with communications channels 1320. The wiring substrate 1302 can include electrically conductive paths (not shown) between connectors 1304 and terminals 1306. The conductive paths (not shown) can be in the form of vias and/or electrical traces (not shown) on or in wiring substrate 1302, which can be any suitable substrate. For example wiring substrate 1302 can be a printed circuit board.

As shown, the probe card assembly 1340 can comprise the electronic device 100 of FIGS. 1-3A, which can be an interposer. For example, contact structures 104 can be pressed against terminals 1306 of the wiring substrate 1302, and contact structures 304 can similarly be pressed against terminals 1311 of probe head 1308. As mentioned above, electrical paths (not shown) (e.g., in the form of vias and/or traces on or through substrate 102) can electrically connect contact structures 104 with contact structures 304. The electronic device 100 can thus electrically connect terminals 1306 on wiring substrate 1302 with terminals 1311 on probe head 1308. In other embodiments, other electronic devices can take the place of electronic device 100 in FIG. 13 and be an interposer in probe card assembly 1340. For example, any of electronic devices 400, 500, and/or 600 can take the place of electronic device 100 in probe card assembly 1340.

Probe card assembly 1340 is exemplary only and many variations are possible. For example, electronic device 100 can be replaced with direct (e.g., rigid connections (not shown)) between terminals 1306 and terminals 1311. Examples of such connections include solder (not shown). As another example, flexible wires (not shown) electrically connecting terminals 1306 and terminals 1311 can replace electronic device 100 in FIG. 13. As yet another example of a modification to probe card assembly 1304, multiple probe heads 1308 can be utilized.

The probe head 1308 can comprise a substrate 1312 (e.g., a wiring substrate made of ceramic or other materials) with electrically conductive, spring-like probes 1314 for contacting and making electrical connections with input and/or output terminals 1324 of DUT 1322. As shown, wall structures 1310 can be can be disposed on substrate 1312. Substrate 1312 can be like substrate 102, and probes can be like contact structures 104 and/or 304 and can be made in the same was as contact structures 104 and/or 304. Similarly, wall structures 1310 can be like, can be made in the same way as, and can serve any of the functions discussed above as any of wall structures 106, 306, 406, 416, 416', 506, 516, 606, and/or 616. Electrical paths (not shown) (e.g., in the form of electrically conductive vias and/or traces on and/or in substrate 1312) can electrically connect terminals 1311 with probes 1314 and/or wall structures 1310.

Brackets 1316 and/or other suitable means can hold the wiring substrate 1302, interposer 1310, and probe head 1312 together. The probe card assembly 1340 can provide a plurality of signal paths comprising the communications channels 1320, the above-described conductive paths through the probe card assembly 1340, and the probes 1314 between the tester 1318 and input and/or output terminals 1324 of DUT 1322, which can be any one or more electronic device to be tested. For example DUT 1322 can be, without limitation, one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronic devices, one or more printed circuit boards, or any other type of electronic device or devices. (DUT 1322 can be a non-limiting example of an electronic component (or device) or an electronic component (or device) to be tested.)

DUT 1322 can be tested as follows. Input and/or output terminals 1324 and probes 1314 can be brought into contact, which can establish electrical connections between the probes 1314 and the input and/or output terminals 1324 of DUT 1322. The tester 1318 can generate test signals, which can be provided through the communications channels 1320 and probe card assembly 1340 and probes 1314 to input terminals 1324 of the DUT 1322. Response signals generated by the DUT 1322 can be sensed by probes 1314 in contact with output terminals 1324 of the DUT and provided through the probe card assembly 1340 and communications channels 1320 to the tester 1318. The tester 1318 can analyze the response signals to determine whether the DUT 1322 responded properly to the test signals and, consequently, whether the DUT 1322 passes or fails the testing. The tester 1318 can alternatively or in addition rate the performance (e.g., operating speed) of the DUT 1322.

The electronic device 100 or any of the various configurations or alternatives in electronic devices 400, 500, 600 need not be configured as an interposer in a probe card assembly (e.g., like probe card assembly 1340). For example, the probe head 1312 can be a modified version of the electronic device 100 shown in FIGS. 1-3B, any of the electronic devices 400, 500, 600 of FIGS. 4-6, or any combination of the foregoing. For example, probe head 1312 can be the electronic device 100 without contact structures 304 and wall structures 306. Thus, for example, referring to FIGS. 3 and 13, terminals 1312 in FIG. 13 can be terminals 308 in FIGS. 3A and 3B; probes 1314 in FIG. 13 can be contact structures 104 in FIGS. 3A and 3B; and wall structures 1310 in FIG. 13 can be wall structures 106 in FIGS. 3A and 3B. Moreover, the electronic device 100 and/or the probe head 1308 in FIG. 13 can be configured with any of the electrical connection configurations discussed herein. For example, electronic device 100 and/or probe head 1308 can be configured to utilize wall structures 106, 306 and/or 1310 to provide reduced inductance power delivery to DUT 1322 as generally discussed above with respect to FIG. 6. As another example, electronic device 100 and/or probe head 1308 can be configured to utilize wall structures 106, 306, and/or 1310 to provide reduced impedance delivery of signals (e.g., alternating current test signals) to DUT 1322 as discussed above with respect to FIGS. 5 and 6. As yet another example, electronic device 100 and/or probe head 1308 can be configured to utilize wall structures 106, 306, and/or 1310 to electromagnetically shield contact structures 106, 306, and/or probes 1314 and/or to provide differential signaling with reduced inductance and/or shielding as also discussed above with respect to FIGS. 4-6.

Figure 14A:
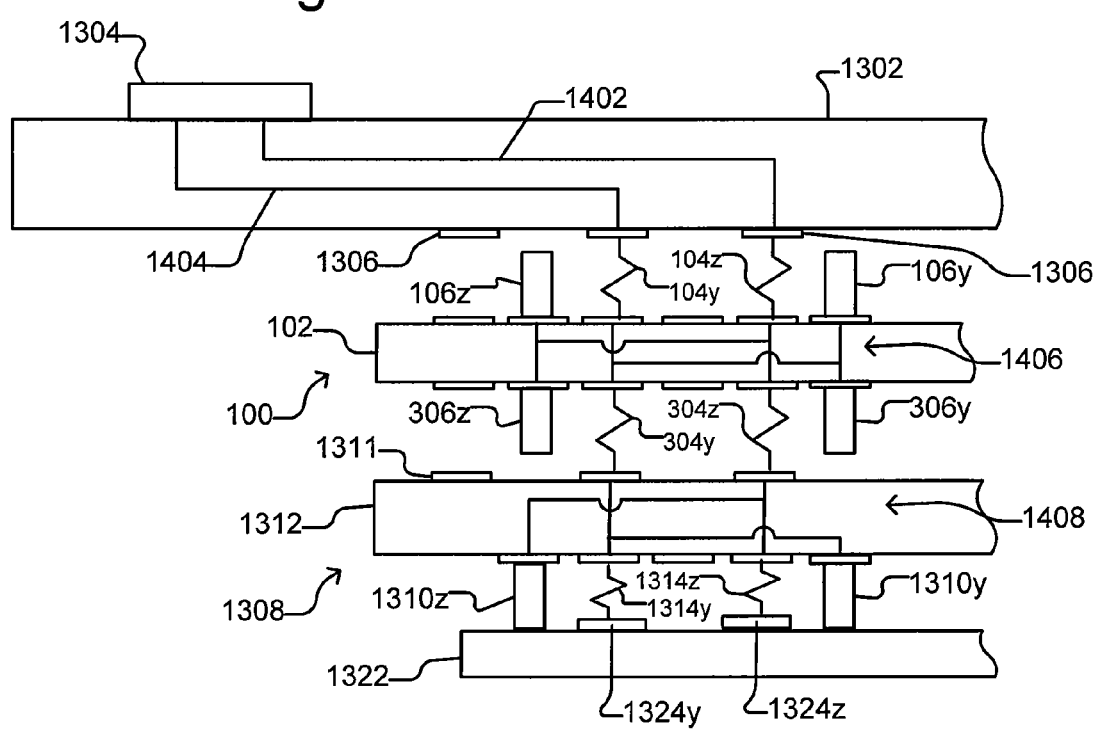
FIGS. 14A and 14B are simplified schematic partial views of the probe card assembly of FIG. 13 illustrating exemplary electrical configurations according to some embodiments of the invention.
Figure 14B:
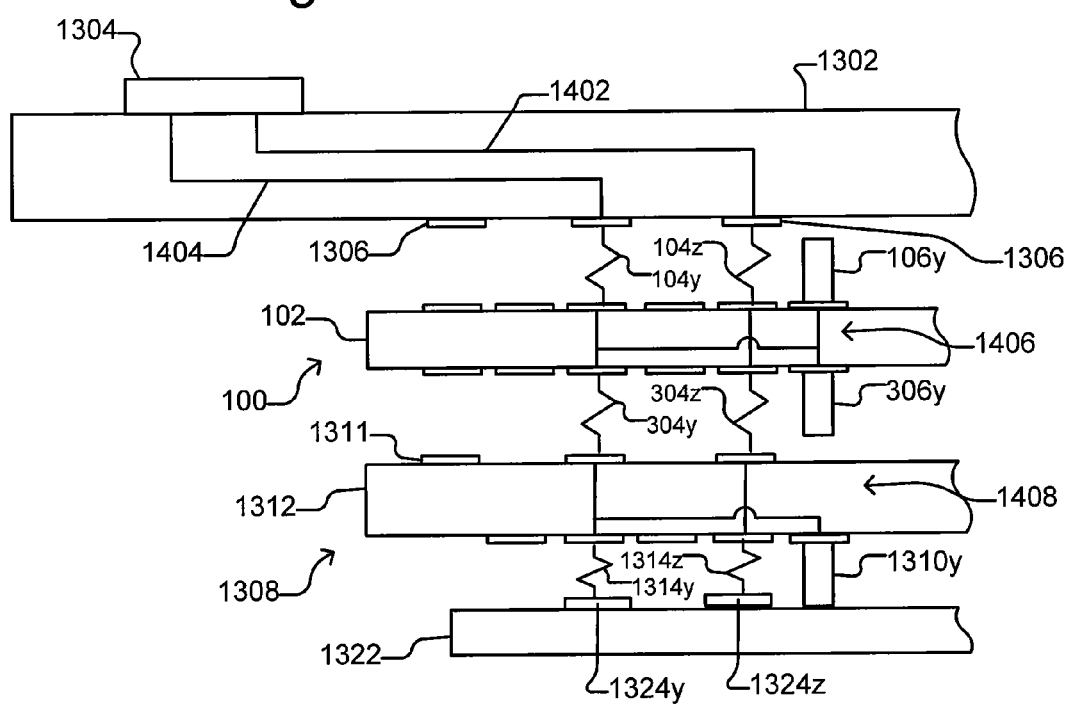

FIG. 14A, which illustrates a simplified schematic partial view of probe card assembly 1340 and DUT 1322, illustrates a non-limiting example in which probe card assembly 1340 is configured to provide reduced inductance deliver of system power from tester 1318 to DUT 1322. The following in FIG. 14A can be configured as a "force" (or system power) electrical path (which can be a non-limiting example of an electrical path) through which system power can be provided to a power input terminal 1324z of DUT 1322: a "force" (e.g., system power) connection in connector 1304 (which can be connected through channels 1320 to a power supply in tester 1318 (see FIG. 13)), electrical path 1402 through wiring substrate 1302, contact structure 104z, portions of electrical paths 1406 through substrate 102, contact structure 304z, portions of electrical paths 1408 through substrate 1312, and probe 1314z (which can contact power input terminal 1324z of DUT 1322 as shown). The following in FIG. 14A can be configured as a "return" (e.g., common ground, which can be ground connections to DUT 1322) electrical path for return current (which can be a non-limiting example of a current return path): probe 1314y (which can contact "return" (e.g., ground) terminal 1324y of DUT 1322), portions of electrical paths 1408 through substrate 1312, contact structure 304y, portions of electrical paths 1406 through substrate 102, contact structure 104y, electrical path 1404 through wiring substrate 1302, and a "return" (e.g., common ground) connection in connector 1304 (which can be connected through channels 1320 to common ground in tester 1318 (see FIG. 13)). Moreover, as shown, wall structures 106y, 306y can be located adjacent contact structures 104z, 304z and can be connected to the "return path" discussed above by portions of electrical paths 1406 on or within substrate 102 as shown in FIG. 14A. Wall structure 1310y can be located adjacent probe 1314z and can be connected to the "return path" discussed above by portions of electrical paths 1408 on or within substrate 1312 as also shown in FIG. 14A. Wall structures 106y, 306y, and 1310y can thus be located adjacent portions of the force path discussed above but electrically connected to the return path discussed above.

As also shown in FIG. 14A, wall structures 106z, 306z, and 1310z can be located adjacent portions of the return path discussed above but electrically connected to the force path discussed above. For example, as shown, wall structures 106z, 306z can be located adjacent contact structures 104y, 304y and can be connected to the "force path" discussed above by portions of electrical paths 1406 on or within substrate 102 as shown in FIG. 14A. Wall structure 1310z can be located adjacent probe 1314y and can be connected to the "force path" discussed above by portions of electrical paths 1408 on or within substrate 1312 as also shown in FIG. 14A. As discussed above with respect to FIG. 6, this can reduce the inductance of the delivery of power through contact structures 104y, 104z, 304y, and 304z and probes 1314z and 1314y of probe card assembly 1340 to DUT 1322.

The configuration shown in FIG. 14A is exemplary only, and many variations are possible. For example, wall structures 106z, 306z, and 1310z can be electrically connected to the return current path (e.g., to contact structures 104y, 304y and/or probe 1314y)—rather than to the force path (e.g., to contact structures 104z, 304z and/or probe 1314z). As another example, wall structures 106z, 306z, and 1310z can be electrically connected neither to the return current path nor to the force path, in which case wall structures 106z, 306z and/or probe 1310z need not be included in the probe card assembly 1340. It is noted that the further wall structures 106z, 306z, 1310z are from the force contact structures 104z, 304z and probe 1314z, the less effective the wall structures 106z, 306z, 1310z can be at reducing inductance. As yet another example, rather than connect wall structures 106y, 306y, and 1310y to the return current path 1404, 104y, 304y, 1314y, wall structures 106y, 306y, and 1310y can alternatively be connected to another return current path. For example, if the return current path is common ground, one or more ground planes (e.g., conductive material on or within wiring substrate 1302, substrate 102, and/or substrate 1312) connected to common ground can be provided on or within wiring substrate 1302, substrate 102, and/or substrate 1312, and wall structures 106y, 306y, and 1310y can be connected to one or more of such ground planes (not shown). In fact, any connection to a return current path that comprises common ground can alternatively be to one or more of such ground planes. As yet another example of a variation of the configuration shown in FIG. 14A, all of the wall structures 106y, 306y, 1310y, 106z, 306z, and/or 1310z shown in FIG. 14A need not be used. For example, wall structures can be provided only on substrate 102, in which case wall structures 1310y and 1310z need not be included. As another example, wall structures can be provided only on substrate 1312, in which case wall structures 106y, 306y, 106z, and 306z need not be included.

FIG. 14B illustrates a variation of the configuration shown in FIG. 14A. In FIG. 14B, probe card assembly can be configured to provide signals (e.g., test signals, which can be alternating current test signals provided by tester 1318 through channels 1320 to probe card assembly 1340 (see FIG. 13)) through contact structures 104z, 304z and probe 1314z, and wall structures 106y, 306y, 1310y, which can be configured to reduce an impedance of contact structures 104z, 304z, and probe 1314z.

The configuration shown in FIG. 14B can be generally similar to at least part of the configuration shown in FIG. 14A except that the "force" path of FIG. 14A can be configured as a signal path in FIG. 14B. That is, the following in FIG. 14B can be configured as a "signal" electrical path (which can be a non-limiting example of an electrical path) through which signals (e.g., alternating current test signals) can be provided to a signal input terminal 1324z of DUT 1322: a "signal" connection in connector 1304 (which can be connected through channels 1320 to a source of signals (e.g., alternating current test signals) in tester 1318 (see FIG. 13)), electrical path 1402 through wiring substrate 1302 (which can be connected to the "signal connection in connector 1304), contact structure 104z, portions of electrical paths 1406 through substrate 102, contact structure 304z, portions of electrical paths 1408 through substrate 1312, and probe 1314z (which can contact a signal input terminal 1324z of DUT 1322 as shown). As in FIG. 14A, the following in FIG. 14B can be configured as a "return" (e.g., common ground) electrical path for return current (which can be a non-limiting example of a current return path): probe 1314y (which can contact "return" (e.g., common ground) terminal 1324y of DUT 1322), portions of electrical paths 1408 through substrate 1312, contact structure 304y, portions of electrical paths 1406 through substrate 102, contact structure 104y, electrical path 1404 through wiring substrate 1302, and a "return" (e.g., common ground) connection in connector 1304 (which can be connected through channels 1320 to common ground in tester 1318 (see FIG. 13)). Moreover, as in FIG. 14A and, as shown in FIG. 14B, wall structures 106y, 306y can be located adjacent contact structures 104z, 304z and can be connected to the "return path" discussed above by portions of electrical paths 1406 on or within substrate 102 as shown in FIG. 14A. In addition, wall structure 1310y can be located adjacent probe 1314z and can be connected to the "return path" discussed above by portions of electrical paths 1408 on or within substrate 1312 as also shown in FIG. 14B. Wall structures 106y, 306y, and 1310y can thus be located adjacent portions of the signal path discussed above but electrically connected to the return path discussed above. As generally discussed above with respect to FIG. 6, the foregoing can reduce the impedance of contact structures 104z and 304z and probe 1314z. Connector 1304, path 1402, and/or contact structures 104z, 304z can be non-limiting examples of an electrical connection electrically connectable to a source of signals (e.g., test signals).

The configuration shown in FIG. 14B is exemplary only, and many variations are possible. For example, if system power is coupled by an alternating current coupler 1390 (e.g., a capacitor or capacitance), which can be a capacitive coupler, to a return current path for system power (e.g., common ground), wall structures 106y, 306y, and 1310y can be electrically connected to system power—rather than to the return path (e.g., to contact structures 104y, 304y and/or probe 1314y). The alternating current coupler 1390 can be anywhere along a power supply line from a power supply (e.g., in tester 1318 (see FIG. 13)) to a power input terminal of DUT 1322. As yet another example, rather than connect wall structures 106y, 306y, and 1310y to the return current path comprising 1404, 104y, 304y, 1314y, wall structures 106y, 306y, and 1310y can alternatively be connected to another return current path. For example, if the return current path is common ground, one or more ground planes (e.g., conductive material on or within wiring substrate 1302, substrate 102, and/or substrate 1312) connected to common ground can be provided on or within wiring substrate 1302, substrate 102, and/or substrate 1312, and wall structures 106y, 306y, and 1310y can be connected to one or more of such ground planes (not shown). In fact, any connection to a return current path that comprises common ground can alternatively be to one or more of such ground planes. Moreover, if wall structures 106y, 306y, and 1310y are connected to system power (as discussed above), wall structures 106y, 306y, and 1310y can be connected to a power plane, which can be like a ground plane described above but connected to system power rather than common ground. Like a ground plane, such a power plane can be on or in wiring substrate 1302, substrate 102, and/or substrate 1312. As yet another example of a variation of the configuration shown in FIG. 14B, all of the wall structures 106y, 306y, and/or 1310y shown in FIG. 14B need not be used. For example, wall structures can be provided only on substrate 102, in which case wall structure 1310y need not be included. As another example, wall structures can be provided only on substrate 1312, in which case wall structures 106y, 306y need not be included.

The configurations shown in FIGS. 14A and 14B can be provided in the same probe card assembly 1340. For example, the reduced inductance power delivery configuration shown in FIG. 14A and the reduced impedance signal delivery shown in FIG. 14B can be implemented in the same probe card assembly 1340. That is, probe card assembly 1340 can include contact structures, probes, and wall structures configured as shown in FIG. 14A for providing reduced inductance power deliver to DUT 1322 and contact structures, probes, and wall structures configured as shown in FIG. 14B to provide reduced impedance signal delivery to DUT 1322. Moreover, multiple instances of the low inductance power delivery configuration shown in FIG. 14A and/or multiple instances of the controlled impedance signal delivery shown in FIG. 14B can be implemented in the same probe card assembly 1340. Alternatively, or in addition, any of the shielding, differential signaling, and other signaling configurations illustrated herein (e.g., in FIGS. 1-6) can be implemented in such a probe card assembly.

Figure 15:
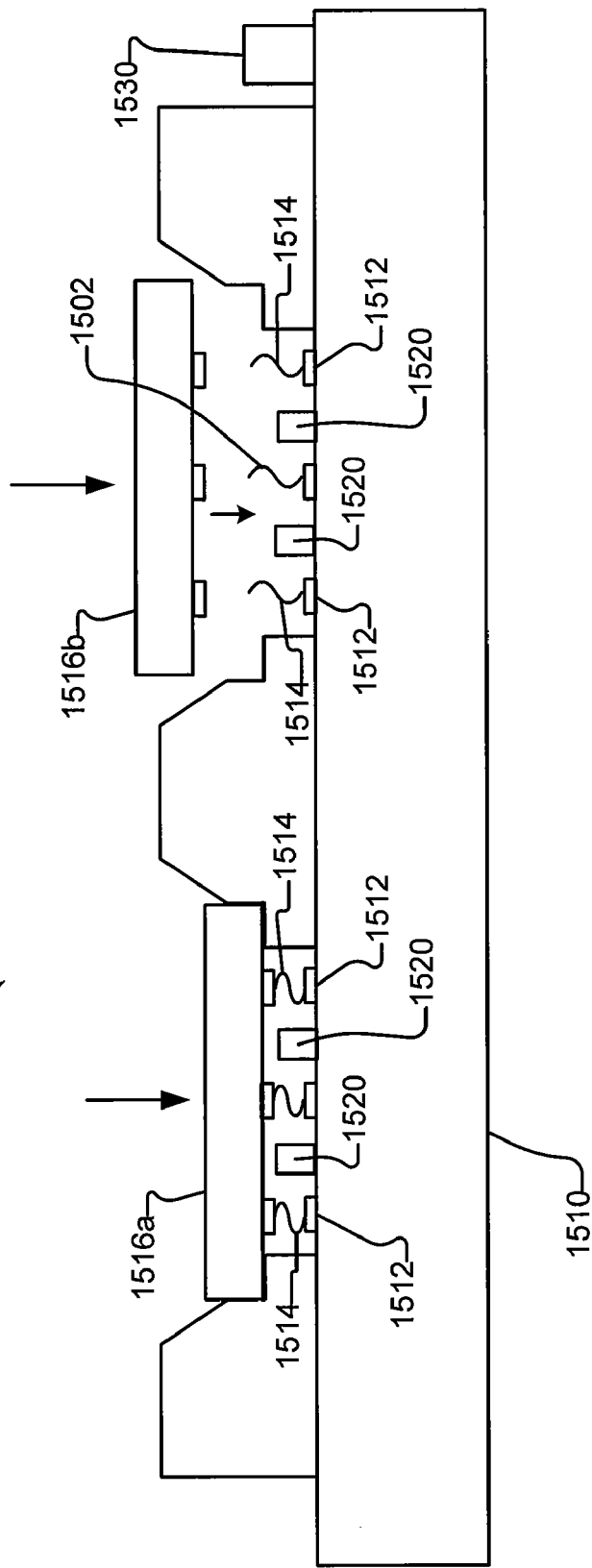
FIG. 15 is a side view of an exemplary test socket according to some embodiments of the invention.

The wall structures and signaling techniques illustrated and discussed herein are not limited to use in a test system or probe card assembly like those illustrated in FIGS. 13, 14A, and 14B. For example, the electronic device 100 illustrated in FIGS. 1-3B or any of the electronic devices 400, 500, 600 shown in FIGS. 4-6 can alternatively be used in a test socket. FIG. 15 illustrates an exemplary test socket 1500 (which can be a non-limiting example of a probing apparatus) having a substrate 1510, terminals 1512, and resilient contact structures 1514 with wall structures 1520 disposed between ones of the contact structures 1514. Contact structures 1514 can be like any of the contact structures 104, 304 and wall structures 1520 can be like any of the wall structures 106, 306, 406, 416, 416', 506, 516, 606, 616 disclosed herein.

As shown in FIG. 15, test socket 1500 can be used to test electronic devices such as electronic devices 1516a, 1516b, which can be like DUT 1322. FIG. 15 depicts electronic device 1516a being pressed against resilient contact structures 1514 of the test socket 1500, and FIG. 15 depicts electronic device 1516b in the process of being pressed against the resilient contact structures 1514. In some embodiments, substrate 1510—which can be a wiring substrate with electrical contacts for connecting to a test controller and internal wiring connecting the electrical contacts to contact structures 1514—can be connected to a test controller, which can control testing of electronic devices 1516a, 1516b.

As can be evident from the foregoing description, some embodiments of the invention can provide advantages over the current state of the art. For example, some embodiments of the electronic device 100 (or electronic device 400, 500, or 600) can provide wall structures 106 for electronic shielding, impedance control, delivery of low inductance power, differential signaling, and/or mechanical protection as discussed herein (e.g., with respect to FIGS. 1-6) while allowing for fine pitch placement of the resilient contact structures 104 on substrate 102. As another example, some embodiments of the electronic device 100 (or electronic device 400, 500, or 600) can provide greater manufacturing efficiency by allowing resilient contact structures 104 and wall structures 106 (or any of wall structures 406, 416, 416', 506, 516, 606, or 616) to be made in a same step or process utilizing a reusable tool 700.

The wall structures 106, 406, 416, 416', 506, 516, 606, and 616 illustrated and discussed herein are exemplary only, and many variations are possible. FIG. 16 illustrates a non-limiting exemplary variation according to some embodiments of the invention. As shown, FIG. 16 illustrates an exemplary electronic device 1600 that can include wiring substrate 102 with terminals 108 (or a similar substrate with terminals, pads, contacts, etc.). In addition, contact structures 104 can be attached to ones of the terminals 108. As shown, wall structures 1606 can be structurally integral with one or more contact structures 104. FIG. 16 illustrates a non-limiting examples in which a wall structure 1606 is structurally integral with all of the contact structures 104 in a row or column of contact structures and two non-limiting examples in which a wall structure 1606 is structurally integral with less than all of the contact structures 104 in a row or column of contact structures. The electronic device 1600 in FIG. 16 is exemplary, and many variations are possible. For example, although three wall structures 1606 are shown in FIG. 16, more or fewer wall structures 1606 can be used. Likewise, more or fewer contact structures 104 can be used. Also, wall structures 1606 can run in different directions than shown in FIG. 16. For example, one or more of wall structure 1606 can run perpendicular to the directions of wall structures 1606 shown in FIG. 16.

FIG. 17 illustrates another non-limiting variation of the wall structures 1606 shown in FIG. 16. As shown in FIG. 17, wall structures 1706 can include one or more perforations, slots, or holes 1720, which can be sized and placed to tailor spring constants of the contacts structures 104 to desired spring constant values. Also, the perforations, slots, or holes 1720 can allow adjacent contact structures 104 to flex or move different distances when pressed against terminals of, for example, a DUT. For example, adjacent ones of such terminals may be different sizes (e.g., such terminals may extend different distances from the DUT), and adjacent contact structures 104 can flex or move different distances in respond to being pressed against such terminals to compensate for the different sizes of the terminals. Otherwise, electronic device 1700 can be like electronic device 1600 including any of the variations discussed above with regard to electronic device 16 and FIG. 16.

FIG. 18 illustrates a variation of wall structures 1606 and 1706. Is shown in FIG. 18, one or more contact structures 104 can have extensions 1806 extending from one or multiple sides of the contact structure 104. The extensions 1806 can be structurally integral with the contact structure 104. As shown, a space 1820 can be provided between extensions 1806 of adjacent contact structures 104. The space 1820 can allow adjacent contact structures 104 to flex or move different distances when pressed against terminals of, for example, a DUT as generally discussed above. In addition, extensions 1806 can provide electrical advantages in some embodiments. For example, extensions 1806 of adjacent contact structures 104 can have capacitance and can thus function as a capacitor. For example, in FIG. 18, extension 1806*a* of contact structure 104*a* and extension 1806*b* of contact structure 104*b* can have capacitance and thus effectively form a capacitor. Such capacitance can provide advantages for power delivered through contact structures 104*a* and 104*b*. For example, assuming contact structure 104*a* is connected to system power and contact structure 104*b* is connected to a return current path (e.g., common ground) for system power, the capacitance between extensions 1806*a* and extensions 1806*b* can provide a number of advantages. For example, the capacitance between extensions 1806*a* and extensions 1806*b* can partially or completely compensate for the inherent inductance in contact structures 104*a* and 104*b*. Contact structures 104*a* and/or 104*b* can alternatively carry alternating current signals, and the foregoing compensation for inherent inductance can reduce the impedance of contact structures 104*a* and/or 104*b* when carrying alternating current signals. As another example, the capacitance between extensions 1806*a* and extensions 1806*b* can provide a ready supply of supplemental current to a DUT (e.g., 1322) or other electronic device contacted by device 1800 when such a DUT requires supplemental current, which can be needed, for example, when such a DUT changes states or for other reasons.

Wall structures 1606, 1706, and/or 1806 in FIGS. 16, 17, and 18 can replace any of the wall structures 106, 406, 416, 416', 506, 516, 606, and/or 616 in any of the embodiments or examples discussed herein.

Although specific embodiments and applications of the invention have been described in this specification, there is no intention that the invention be limited to these exemplary embodiments and applications or to the manner in which the exemplary embodiments and applications operate or are described herein. For example, the resilient contact structures 104 can be formed directly on the substrate 102 instead of formed on the tool 700 and then subsequently attached to the substrate 102. Also, the tool 700 can be shaped differently from those shown in the drawing Figures so as to produce wall structures 106 and resilient contact structures 104 of various shapes. Some tools 700, for example, can be shaped to form tips that extend from the ends of the resilient contact structures 104 to allow the resilient contact structures 104 to provide better electrical contact. Some tools 700 can be shaped to form a single probe 104 and/or wall structure 106, and others can be shaped to form an array of resilient contact structures 700 and/or wall structures 106. Also, the resilient contact structures 104 and/or wall structures 106 can be formed by a plurality of plating layers. Further modifications to the exemplary embodiments described herein can be included within the scope of the invention.

We claim:

1. An electronic apparatus comprising:
a substrate;
a plurality of electrically conductive resilient contact structures extending from the substrate, a first of the contact structures being part of an electrical path through the electronic apparatus, the contact structures configured to be compressed by contact with terminals of a device and thereby make electrical connections with the terminals; and
a first electrically conductive rigid wall structure extending from the substrate and disposed adjacent at least one of the contact structures, an end surface of the rigid wall structure disposed to contact directly the device and thereby limit compression of the resilient contact structures by the device, wherein the first wall structure is electrically connected to a return current path within the electronic apparatus for alternating current signals or system power on the first contact structure.

2. The electronic apparatus of claim 1 further comprising an electrical connection for electrically connecting the electrical path to a source of the alternating current signals.

3. The electronic apparatus of claim 2, wherein the return current path is connected to common ground.

4. The electronic apparatus of claim 2, wherein the return current path is connected to system power, and the system power is coupled by an alternating current coupler to common ground.

5. The electronic apparatus of claim 4, wherein the alternating current coupler comprises a capacitor electrically connecting the system power to the common ground.

6. The electronic apparatus of claim 1 further comprising an electrical connection for electrically connecting the electrical path to the system power.

7. The electronic apparatus of claim 6, wherein the return current path is connected to common ground.

8. The electronic apparatus of claim 6, wherein:
a second of the contact structures is part of the return current path;
a second electrically conductive rigid wall structure extends from the substrate and is disposed adjacent the second contact structure; and
the second wall structure is electrically connected to the electrical path.

9. The electronic apparatus of claim 8, wherein the return current path is connected to common ground.

10. The electronic apparatus of claim 1, wherein:
the first contact structure and the first wall structure extend from a first surface of the substrate;
a second of the contact structures extends from a second surface of the substrate, the second surface being opposite the first surface, the second contact structure being electrically connected to the first contact structure through the substrate, the second contact structure being part of the electrical path;
the apparatus further comprising:
a second electrically conductive rigid wall structure extending from the second surface of the substrate and disposed adjacent the second contact structure, the second wall structure being electrically connected to the return current path.

11. The electronic apparatus of claim 1, wherein:
a multiplicity of the contact structures are disposed in at least two rows;
a first portion of the wall structure is disposed between ones of the contact structures in different rows; and
a second portion of the wall structure is disposed adjacent at least one of the contact structures in one of the rows.

12. The electronic apparatus of claim 1, wherein:
ones of the contact structures are disposed in a row;
a length of a wall structure extends less than a length of the rows.

13. The electronic apparatus of claim 1, wherein each of ones of the contact structures comprise extension structures extending from opposite sides of the contact structure.

14. The electronic apparatus of claim 1, wherein the electronic apparatus is part of a probe card assembly comprising an electrical interface to a tester and a plurality of probes for contacting an electronic component to be tested, the electrical path extending from the interface to one of the probes.

15. The electronic apparatus of claim 1, wherein, while each of the contact structures is uncompressed, each of the contact structures extends a greater distance from the substrate than a distance the first wall structure extends from the substrate.

16. An electronic apparatus comprising:
a substrate;
a plurality of electrically conductive resilient contact structures extending from the substrate, a first of the contact structures being part of an electrical path through the electronic apparatus; and
a first electrically conductive wall structure extending from the substrate and disposed adjacent at least one of the contact structures, wherein the first wall structure is electrically connected to a return current path within the electronic apparatus for alternating current signals or system power on the first contact structure, wherein:
the first contact structure and the first wall structure extend from a first surface of the substrate;
a second of the contact structures extends from a second surface of the substrate, the second surface being opposite the first surface, the second contact structure being electrically connected to the first contact structure through the substrate, the second contact structure being part of the electrical path;
the electronic apparatus further comprising:
a second electrically conductive wall structure extending from the second surface of the substrate and disposed adjacent the second contact structure, the second wall structure being electrically connected to the return current path,
wherein:
a third of the contact structures extends from the first surface of the substrate and is part of the return current path;
a fourth of the contact structures extends from the second surface of the substrate and is part of the return current path, the fourth contact structure being electrically connected through the substrate to the third contact structure;
the electronic apparatus further comprising:
a third electrically conductive wall structure extending from the first surface of the substrate and disposed adjacent the fourth contact structure, the fourth wall structure being electrically connected to the electrical path; and
a fourth electrically conductive wall structure extending from the second surface of the substrate and disposed adjacent the third contact structure, the third wall structure being electrically connected to the electrical path.

17. The electronic apparatus of claim 16, wherein:
the first wall structure is rigid,
the second wall structure is rigid,
the third wall structure is rigid, and
the fourth wall structure is rigid.

18. A process of testing an electronic device (DUT), the process comprising:
effecting contact between a probing apparatus and the DUT, the contact establishing a plurality of electrical paths through the probing apparatus to the DUT;
providing one of system power or test signals to the DUT through an electrical path within the probing apparatus, the electrical path comprising a first resilient contact structure extending from a surface of a substrate that is part of the probing apparatus, the contact structures configured to be compressed by contact with terminals of a device and thereby make electrical connections with the terminals; and
returning current from the one of the system power or the test signals through a return current path that is electrically connected to a first electrically conductive rigid wall structure extending from the surface of the substrate and disposed adjacent the first contact structure, an end surface of the rigid wall structure disposed to contact directly the device and thereby limit compression of the resilient contact structures by the device.

19. The process of claim 18, wherein the providing comprises providing test signals that are alternating current signals through the electrical path to the DUT.

20. The process of claim 19, wherein the return current path is common ground connected to the DUT.

21. The process of claim 19, wherein the return current path is connected to the system power provided to the DUT, the process further comprising coupling by an alternating current coupling mechanism the system power to common ground connected to the DUT.

22. The process of claim 21, wherein the coupling comprises capacitively coupling the system power to the common ground.

23. The process of claim 18, wherein the providing comprises forcing system power through the electrical path to the DUT.

24. The process of claim 23, wherein:
the return current path comprises a second resilient contact structure extending from the surface of the substrate; and
the electrical path is electrically connected to a second electrically conductive rigid wall structure extending from the surface of the substrate and disposed adjacent the second contact structure.

25. The process of claim 23, wherein the return current path is common ground.

26. The process of claim 18, wherein the probing apparatus is a probe card assembly comprising an interface to a tester configured to control testing of the DUT and a plurality of probes for contacting terminals of the DUT, the electrical paths being between the interface the probes; and
the process further comprises connecting the interface of the probing apparatus to the tester.

* * * * *